(12) United States Patent
Baek et al.

(10) Patent No.: US 12,033,717 B2
(45) Date of Patent: Jul. 9, 2024

(54) CALIBRATION CIRCUIT AND SEMICONDUCTOR DEVICE INCLUDING THE SAME

(71) Applicant: Samsung Electronics Co., Ltd., Suwon-si (KR)

(72) Inventors: Jaehyeok Baek, Suwon-si (KR); Daehyun Kwon, Suwon-si (KR); Hyejung Kwon, Seoul (KR); Donggun An, Suwon-si (KR); Daewoong Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 121 days.

(21) Appl. No.: 17/903,578

(22) Filed: Sep. 6, 2022

(65) Prior Publication Data

US 2023/0186958 A1 Jun. 15, 2023

(30) Foreign Application Priority Data

Dec. 14, 2021 (KR) .......................... 10-2021-0178532
Mar. 8, 2022 (KR) .......................... 10-2022-0029491

(51) Int. Cl.
*G11C 7/10* (2006.01)

(52) U.S. Cl.
CPC .... *G11C 7/1048* (2013.01); *G11C 2207/2254* (2013.01)

(58) Field of Classification Search
CPC .......... G11C 7/1048; G11C 2207/2254; G11C 7/1057; G11C 7/1084; G11C 11/4093; G11C 7/10; G11C 7/08
See application file for complete search history.

(56) References Cited

U.S. PATENT DOCUMENTS

| | | | |
|---|---|---|---|
| 6,680,623 B2 | 1/2004 | Hirai et al. | |
| 7,495,975 B2 | 2/2009 | Lee et al. | |
| 7,795,905 B2 | 9/2010 | Sohn | |
| 8,031,543 B2 | 10/2011 | Knoll | |
| 10,468,073 B2 | 11/2019 | Contreras et al. | |
| 10,498,564 B2 | 12/2019 | Jalali Far et al. | |
| 10,530,325 B1 | 1/2020 | Gonzales et al. | |
| 10,586,775 B2 | 3/2020 | Kim et al. | |

(Continued)

FOREIGN PATENT DOCUMENTS

KR 10-2018-0062809 A 6/2018

*Primary Examiner* — Ajay Ojha
(74) *Attorney, Agent, or Firm* — Harness, Dickey & Pierce, P.L.C.

(57) ABSTRACT

A calibration circuit includes a first, second and third pull-up units each connected to a first power supply node, and first and second pull-down units each connected to a second power supply node. A first code generator is configured to generate a first code by comparing a voltage of a pad at which the first pull-up unit is connected to an external resistor with a reference voltage, and a second code generator is configured to generate a second code by comparing a voltage of a first intermediate node with the reference voltage and output the second code to the first and second pull-down units. A third code generator is configured to generate a third code by comparing a voltage of a second intermediate node between the second pull-down unit and the third pull-up unit with the reference voltage.

20 Claims, 21 Drawing Sheets

(56) References Cited

U.S. PATENT DOCUMENTS

2007/0146004 A1* 6/2007 Park .................... G11C 7/1084
326/30
2017/0194946 A1* 7/2017 Lee .................. H03K 3/356113
2018/0158495 A1   6/2018 Jeon et al.

* cited by examiner

CALIBRATION CIRCUIT AND SEMICONDUCTOR DEVICE INCLUDING THE SAME

CROSS-REFERENCE TO RELATED APPLICATION(S)

This application claims the benefit of priority to Korean Patent Application No. 10-2021-0178532 filed on Dec. 14, 2021 and Korean Patent Application No. 10-2022-0029491 filed on Mar. 8, 2022 in the Korean Intellectual Property Office, the disclosures of which are incorporated herein by reference in their entirety.

BACKGROUND

Some example embodiments of the inventive concepts relate to a calibration circuit and a semiconductor device including the same.

A semiconductor device may include pads connected to external devices, and the pads may be connected to an input/output circuit including at least one of a transmitter and a receiver included in the semiconductor device. A ZQ calibration operation may be performed in the semiconductor device to reduce distortion occurring when the input/output circuit transmits signals to and receives signals from external devices through the pads and to improve signal integrity. Also, recently, to reduce or prevent deterioration of signal integrity due to an input/output circuit and a parasitic component present between the input/output circuit and the pad, a structure for connecting a transmission coil between the pad and the input/output circuit has been suggested.

SUMMARY

Some example embodiments of the inventive concepts may provide a calibration circuit which may, by applying resistance according to codes generated by different ZQ calibration operations to each of an input/output circuit to which a transmission coil is connected and an input/output circuit to which a transmission coil is not connected, reduce distortion of a signal and may reduce deterioration of integrity in consideration of influence of a resistive component of the transmission coil, and a semiconductor device including the same.

According to some example embodiments of the inventive concepts, a calibration circuit includes a first pull-up unit, a second pull-up unit and a third pull-up unit each connected to a first power supply node configured to supply a first power supply voltage, and a first pull-down unit and a second pull-down unit each connected to a second power supply node configured to supply a second power supply voltage smaller than the first power supply voltage. The circuit includes a first code generator configured to generate a first code by comparing a voltage of a pad at which the first pull-up unit is connected to an external resistor with a reference voltage, and a second code generator configured to generate a second code by comparing a voltage of a first intermediate node with the reference voltage and output the second code to the first and second pull-down units. The first intermediate node is between the second pull-up unit and a coil, and the second pull-up unit is configured to provide resistance according to the first code or a shift code obtained by shifting the first code. The circuit includes a third code generator configured to generate a third code by comparing a voltage of a second intermediate node between the second pull-down unit and the third pull-up unit with the reference voltage.

According to some example embodiments of the inventive concepts, a calibration circuit includes a first code generator circuit including a first pull-up unit connected to a pad, and a first comparator having an input terminal connected to the pad and an output terminal connected to the first pull-up unit. The pad is connected to an external resistor. The calibration circuit includes a second code generator circuit including a second pull-up unit connected to the output terminal of the first comparator, a first coil connected to the second pull-up unit, a first pull-down unit connected to the first coil, and a second comparator having an input terminal connected to a node between the first coil and the second pull-up unit. The second comparator includes an output terminal connected to the first pull-down unit. The calibration circuit includes a third code generator circuit including a second pull-down unit connected to an output terminal of the second comparator, a third pull-up unit, and a third comparator having an input terminal connected to a node between the second pull-down unit and the third pull-up unit. The third comparator includes an output terminal connected to the third pull-up unit.

According to some example embodiments of the inventive concepts, a semiconductor device includes a first pad configured to transmit and receive a first signal at a first rate. The first pad is connected to a transmission coil. The device includes a second pad configured to receive a second signal at a second rate slower than the first rate, a third pad connected to an external resistor, and a calibration circuit including a first code generator configured to generate a first code by comparing a voltage of the third pad with a reference voltage, a second code generator configured to generate a second code by comparing the reference voltage with a voltage of a first intermediate node at which a pull-up unit configured to provide resistance according to the first code is connected to a first coil, and a third code generator configured to generate a third code by comparing the reference voltage with a voltage of a second intermediate node to which a pull-down unit configured to provide resistance according to the second code is connected. Pull-up resistance connected to the second pad is determined by the first code, pull-down resistance connected to the first pad is determined by the second code, pull-up resistance connected to the first pad is determined by the third code, and inductance of the first coil is equal to inductance of the transmission coil.

BRIEF DESCRIPTION OF DRAWINGS

The above and other aspects, features, and advantages of the inventive concepts may be more clearly understood from the following detailed description, taken in combination with the accompanying drawings, in which.

DETAILED DESCRIPTION

Hereinafter, some example embodiments of the inventive concepts will be described as follows with reference to the accompanying drawings.

Figure 1:
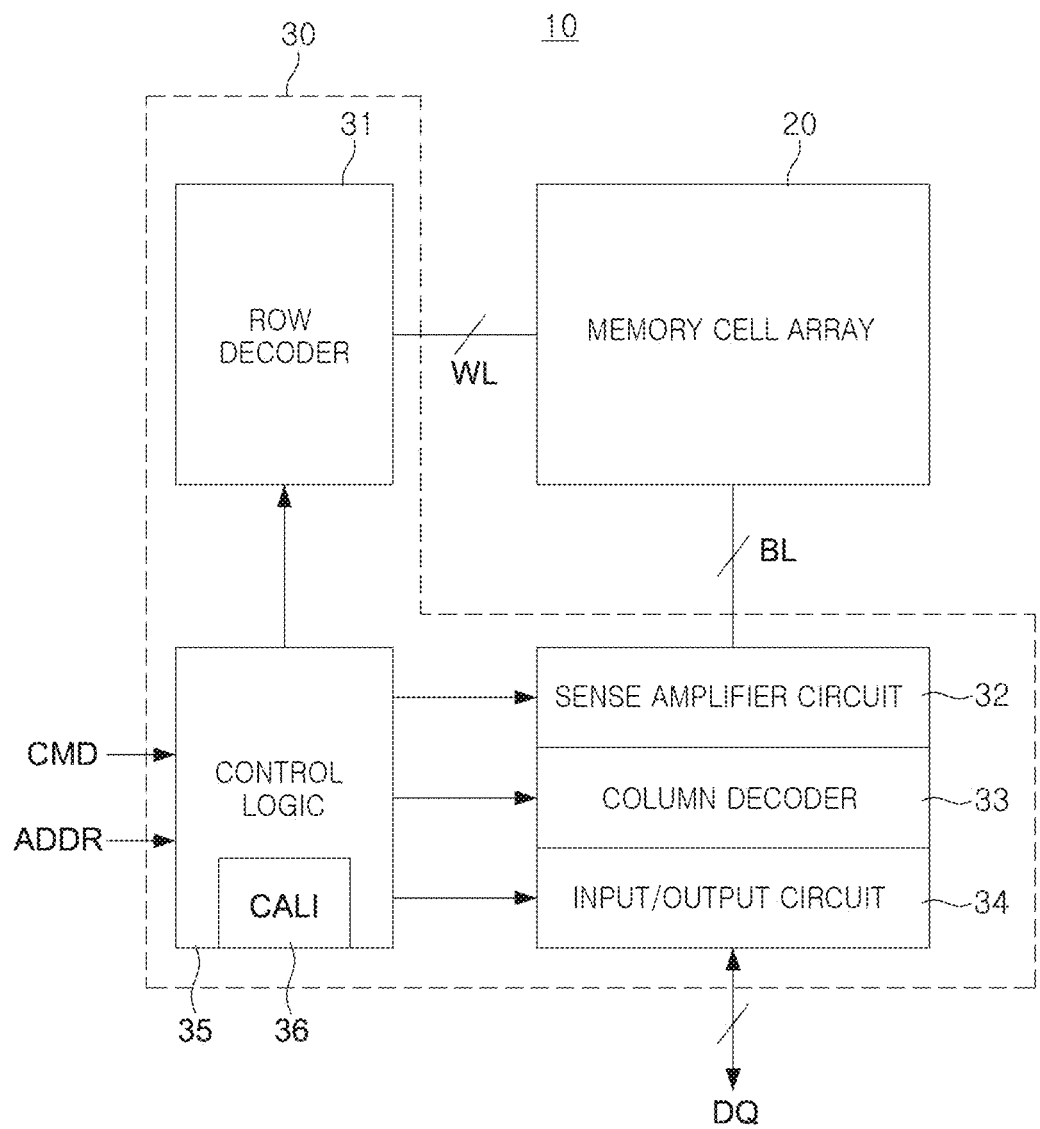
FIG. 1 is a block diagram illustrating a semiconductor device according to an example embodiment of the inventive concepts.

FIG. 1 is a block diagram illustrating a semiconductor device according to an example embodiment.

Referring to FIG. 1, a semiconductor device 10 may be configured as a memory device storing data and reading stored data. The semiconductor device 10 may be configured as a random access memory (RAM) device, such as a dynamic random access memory (DRAM), a synchronous DRAM (SDRAM), a static RAM (SRAM), a double date rate SDRAM (DDR SDRAM), DDR2 SDRAM, DDR3 SDRAM, a phase-change RAM (PRAM), a magnetic RAM (MRAM), or resistive RAM (RRAM), etc., but example embodiments are not limited thereto. The semiconductor device 10 may store data received through a data signal DQ, may output data as the data signal DQ in response to an address signal and a command signal received from an external host (e.g., a central processing unit (CPU), an application processor (AP), a system on a chip (SoC)), etc. The semiconductor device 10 may include a memory cell array 20 and a peripheral circuit 30, and the peripheral circuit 30 may include a row decoder 31, a sense amplifier circuit 32, a column decoder 33, an input/output circuit 34 and control logic 35.

The memory cell array 20 may include a plurality of memory cells, and the plurality of memory cells may be connected to the row decoder 31 and the sense amplifier circuit 32 through a plurality of word lines WL and a plurality of bit lines BL. Each of the plurality of memory cells may be disposed at a point at which the plurality of word lines WL and the plurality of bit lines BL intersect each other. The plurality of memory cells may be arranged in matrix form in the memory cell array 20, and each of the plurality of memory cells may include at least one memory device for storing data. For example, when the semiconductor device 10 is configured as a DRAM, each of the plurality of memory cells may include a switch device and a cell capacitor.

The control logic 35 may receive an address signal ADDR and a command signal CMD from an external host. The address signal ADDR may include a row address indicating a row in the memory cell array 20 and a column address indicating a column in the memory cell array 20. For example, the row decoder 31 may select at least one of the plurality of word lines WL with reference to the row address, and the column decoder 33 may select at least one of the plurality of bit lines BL with reference to the column address.

The sense amplifier circuit 32 may include a plurality of bit line sense amplifiers connected to the memory cell array 20 through the plurality of bit lines BL. Among the plurality of bit line sense amplifiers, a bit line sense amplifier connected to a selected bit line selected by the column decoder 33 may read data from at least one of memory cells connected to the selected bit line. The input/output circuit 34 may output data read by the bit line sense amplifier as a data signal DQ.

The control logic 35 may include a calibration circuit 36. The calibration circuit 36 may perform a ZQ calibration operation when the semiconductor device 10 is connected to an external host and starts operating. The ZQ calibration operation may include an operation of adjusting impedance to ensure integrity of the data signal DQ input/output through the input/output circuit 34 and the command signal CMD and address signal ADDR received by the control logic 35.

For example, by increasing a data rate, which may be a speed at which the semiconductor device 10 and the external host exchange the data signal DQ, performance of the semiconductor device 10 may improve. When the data rate at which the input/output circuit 34 inputs/outputs the data signal DQ increases, due to a parasitic component present between an output terminal of the transmitter and an input terminal the receiver, included in the input/output circuit 34, and the DQ pad inputting/outputting the data signal DQ, integrity of the data signal DQ may be deteriorated and an eye margin may decrease.

In some example embodiments, the input/output circuit 34 may include a coil connected to at least one of a transmitter and a receiver, and influence of a parasitic component may be reduced or canceled by inductance of the coil. Accordingly, the data signal DQ may be input and output at a relatively high data rate and integrity of the data signal DQ may be secured.

However, when the input/output circuit 34 includes a coil, impedance mismatch may occur due to a resistive component present in the coil as the calibration circuit 36 performs the ZQ calibration operation (e.g., by a general method). In some example embodiments, a coil having the same or substantially the same inductance as that of the coil included in the input/output circuit 34 may be included in the calibration circuit 36, and the calibration circuit 36 may determine pull-up resistance and pull-down resistance applied to the input/output circuit 34 by reflecting a resistive component of the coil in the ZQ calibration operation. Accordingly, integrity of the data signal DQ may be secured while inputting and outputting the data signal DQ at a relatively high data rate, and impedance may be effectively matched.

In some example embodiments, the semiconductor device may receive signals other than the data signal DQ from the external host at a relatively high data rate. For example, a data clock signal for inputting and outputting the data signal DQ may be received from an external host at a relatively high data rate. In this case, a coil for reducing influence of parasitic component may be connected to the input terminal of the receiver receiving the data clock signal. The calibration circuit 36 may determine resistance connected to the pad receiving the data clock signal in consideration of a resistive component of the coil.

Figure 2:
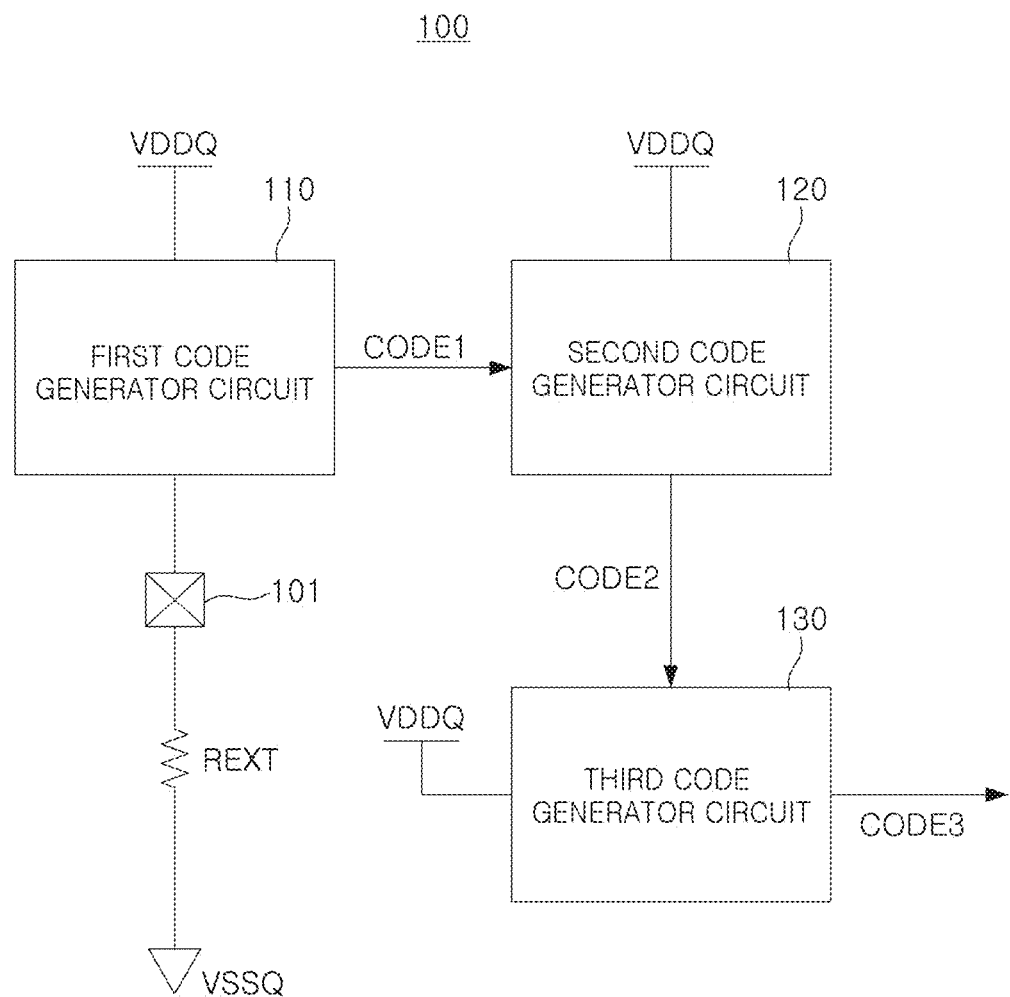
FIG. 2 is a block diagram illustrating a calibration circuit according to an example embodiment of the inventive concepts.

FIG. 2 is a block diagram illustrating a calibration circuit according to an example embodiment.

Referring to FIG. 2, the calibration circuit 100 in an example embodiment may include a first code generator circuit 110, a second code generator circuit 120, and a third code generator circuit 130. The calibration circuit 100 may operate by a first power supply voltage VDDQ and a second power supply voltage VSSQ smaller than the first power supply voltage VDDQ. For example, the first power supply voltage VDDQ and the second power supply voltage VSSQ may be configured as power supply voltages input to the input/output circuit of the semiconductor device including the calibration circuit 100.

The first code generator circuit 110 may be connected to an external resistor device REXT through the ZQ pad 101 and may be connected to a first power supply node supplying the first power supply voltage VDDQ. The external resistor device REXT may be configured as a resistor present externally of the semiconductor device including the calibration circuit 100, and may be connected to a second power supply node supplying the second power supply voltage VSSQ. The external resistor device REXT may be configured as a passive device which may not be affected by fluctuations in process, voltage, temperature (PVT) of the semiconductor device.

The first code generator circuit 110 may output a first code CODE1. For example, the first code generator circuit 110 may include a pull-up unit receiving the first power supply voltage VDDQ, and the first code CODE1 may be configured to input to the first pull-up unit when the pull-up unit of the first code generator circuit 110 has the same or substantially the same level of resistance as that of the external resistor device REXT. The first code CODE1 may be configured data of 2 bits or more.

The first code CODE1 may be input to the second code generator circuit 120. For example, the second code generator circuit 120 may include at least one pull-up unit and at least one pull-down unit. The pull-up unit of the second code generator circuit 120 may have a level of resistance determined by the first code CODE1. In some example embodiments, the first code CODE1 may be directly input to the pull-up unit of the second code generator circuit 120, a shift code obtained by shifting the first code CODE1 may be input to the pull-up unit of the second code generator circuit 120, etc.

Resistance of the pull-down unit of the second code generator circuit 120 may be determined by resistance of the pull-up unit of the second code generator circuit 120. For example, resistance of the pull-down unit of the second code generator circuit 120 may be determined by the second code CODE2 output by the second code generator circuit 120.

The second code generator circuit 120 may include at least one coil, and for example, the coil may be connected between the pull-up unit and the pull-down unit. The coil of the second code generator circuit 120 may be implemented as a duplicate coil of a coil included in the semiconductor device together with the calibration circuit 100, connected to at least one of a plurality of pads of the semiconductor device and compensating for influence of a parasitic component. For example, when the semiconductor device is a memory device, a coil may be connected to a pad for inputting and outputting data signals to the semiconductor device, and the coil of the second code generator circuit 120 may be a duplicate coil of a coil connected to a pad for inputting and outputting data signals.

Accordingly, a resistive component of the coil may be reflected in the second code CODE2. The second code generator circuit 120 may generate a second code CODE2 determining resistance of the pull-down unit of the second code generator circuit 120 by reflecting a resistive component of the coil, and may output the code to the third code generator circuit 130. The third code generator circuit 130 may include at least one pull-up unit and one pull-down unit, and resistance of the pull-down unit of the third code generator circuit 130 may be determined by the second code CODE2.

Accordingly, the pull-down unit of the third code generator circuit 130 may have a level of resistance in which a resistive component of the coil is reflected, and the pull-up unit of the third code generator circuit 130 may also have a level of resistance in which a resistive component of the coil is reflected. The third code generator circuit 130 may generate a third code CODE3 determining resistance of the pull-up unit.

In other words, the first code CODE1 may be configured as a code in which a resistive component of the coil is not considered, and each of the second code CODE2 and the third code CODE3 may be configured as a code in which a resistive component of the coil is reflected. When the ZQ calibration operation is completed by the calibration circuit 100, the first code CODE1 may be used to determine resistance of the pad to which the coil is not connected in the semiconductor device. The second code CODE2 and the third code CODE3 may be used to determine resistance of the pad to which the coil is connected in the semiconductor device. For example, pull-down resistance of the pad to which the coil is connected may be determined by the second code CODE2, and pull-up resistance of the pad to which the coil is connected may be determined by the third code CODE3.

Figure 3:
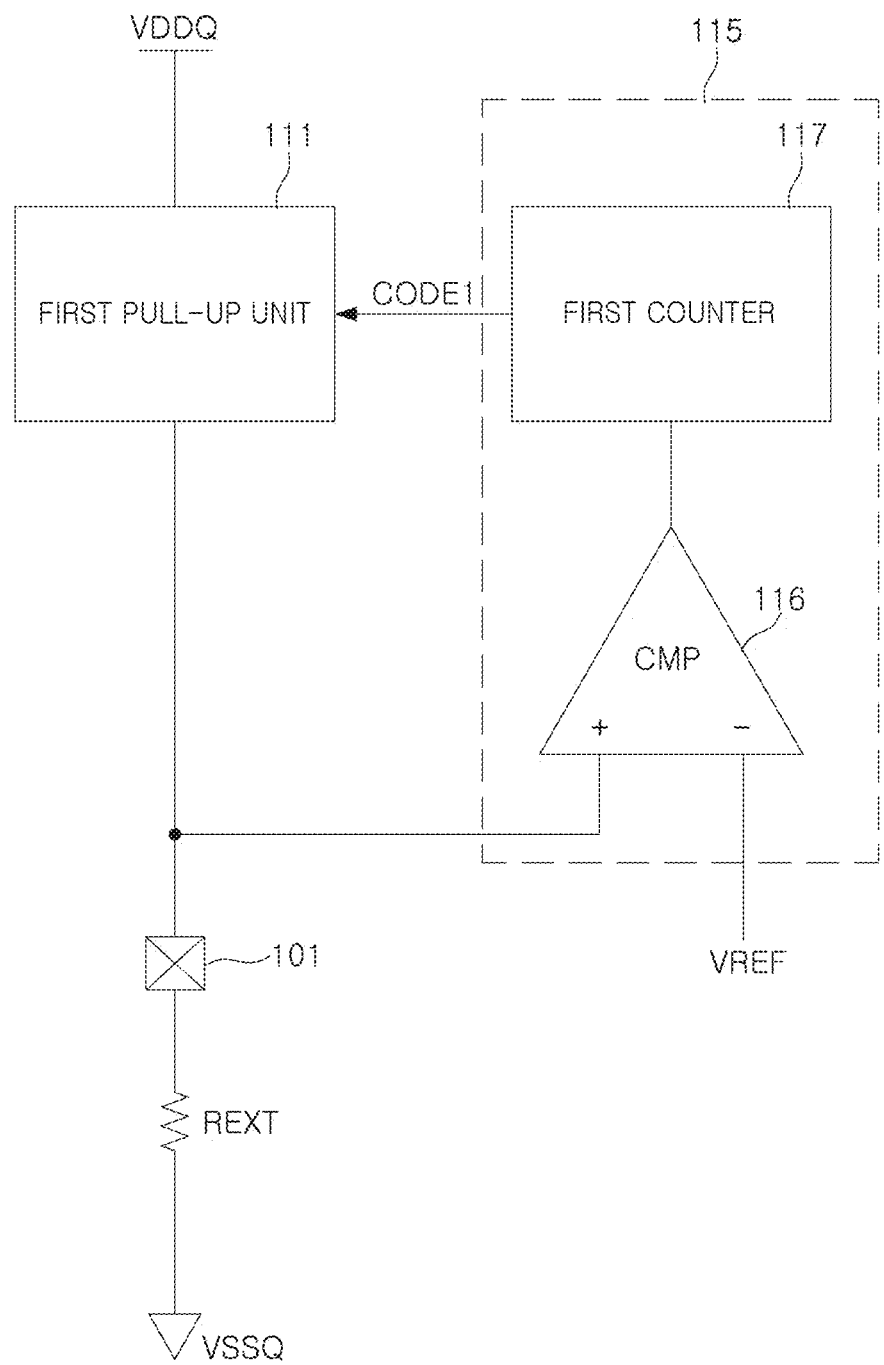
FIG. 3 is a circuit diagram illustrating a first code generator circuit included in a calibration circuit according to an example embodiment of the inventive concepts.

FIG. 3 is a circuit diagram illustrating a first code generator circuit included in a calibration circuit according to an example embodiment.

Referring to FIG. 3, the first code generator circuit 110 may include a first pull-up unit 111 and a first code generator 115, and the first code generator 115 may include a first comparator 116 and a first counter 117. The first pull-up unit 111 may be connected between the first power supply node supplying the first power supply voltage VDDQ and the ZQ pad 101. As described in the aforementioned example embodiment with reference to FIG. 2, an external resistor device REXT may be connected to the ZQ pad 101, and the external resistor device REXT may be configured as a passive device not affected by the semiconductor device.

The first comparator 116 may include a first input terminal and a second input terminal, the first input terminal may be connected to the ZQ pad 101, and a desired (or, alternatively predetermined) reference voltage VREF may be input to the second input terminal. When the ZQ calibration operation starts, the voltage divided by the first pull-up unit 111 and the external resistor device REXT may be input to the first input terminal of the first comparator 116.

In an example embodiment, the reference voltage VREF may be predetermined to have a level of ½ of the first power supply voltage VDDQ (or a lesser or greater ratio of the first power supply voltage VDDQ). The first counter 117 may be connected to the output terminal of the first comparator 116, and may generate the first code CODE1 with reference to the output terminal of the first comparator 116. The first code CODE1 may be input to the first pull-up unit 111, and resistance of the first pull-up unit 111 may increase or decrease in response to the first code CODE1.

The first code generator circuit 110 may adjust the first code CODE1 and may output the code such that a voltage input to the first input terminal of the first comparator 116 may be equalized or substantially equalized to the reference voltage VREF during the ZQ calibration operation. In other words, when the adjustment of the first code CODE1 is completed, resistance of the first pull-up unit 111 may be equal to resistance of the external resistor device REXT. The adjusted first code CODE1 may be stored in a separate register, and for example, the first code CODE1 may be stored in a register included in the first counter 117.

Figure 4:
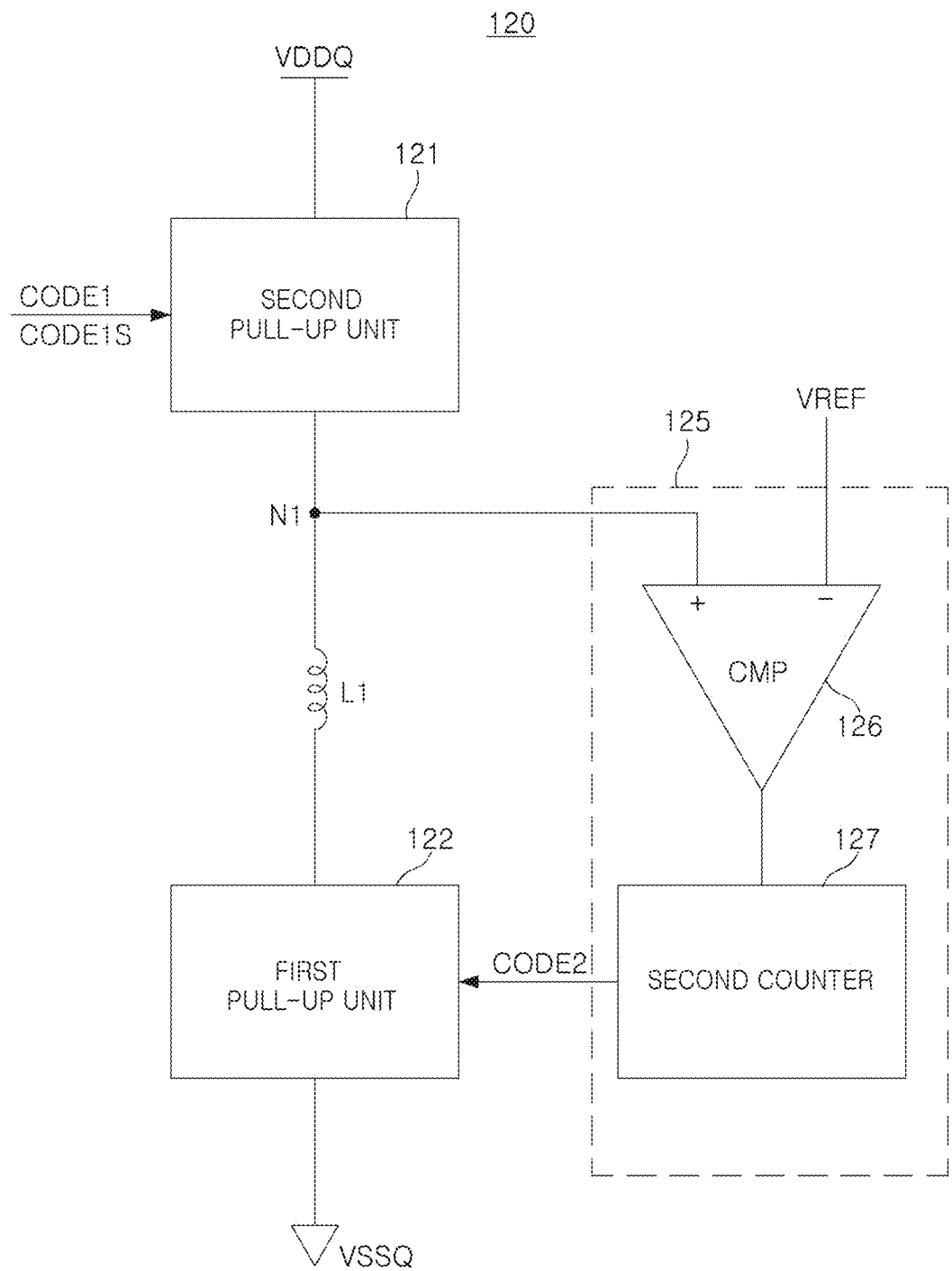
FIG. 4 is a circuit diagram illustrating a second code generator circuit included in a calibration circuit according to an example embodiment of the inventive concepts.

FIG. 4 is a circuit diagram illustrating a second code generator circuit included in a calibration circuit according to an example embodiment.

Referring to FIG. 4, the second code generator circuit 120 in an example embodiment may include a second pull-up unit 121, a first pull-down unit 122, and a second code generator 125. The second pull-up unit 121 may receive a first power supply voltage VDDQ, and may receive at least one of a first code CODE1 and a shift code CODE1S obtained by shifting the first code CODE1.

Resistance of the second pull-up unit 121 may be determined by the first code CODE1, the shift code CODE1S, etc. As described in the aforementioned example embodiment with reference to FIG. 3, the first code CODE1 may be configured as a digital code generated by the first code generator circuit 110, and the first code generator circuit 110 may generate the first code CODE1 such that resistance of the first pull-up unit 111 may be equalized or substantially equalized to resistance of the external resistor device REXT.

The second pull-up unit 121 may be connected to the first intermediate node N1, and the first coil L1 may be connected to the first intermediate node N1. The first coil L1 may be configured as a duplicate component of a coil included in a semiconductor device such as the second code generator circuit 120. For example, a semiconductor device including the second code generator circuit 120 may include a coil connected between a transmitter and/or a receiver of an input/output circuit and a pad, and as a component replicating this coil, the first coil L1 may be included in the second code generator circuit 120. The first coil L1 may be connected between the first intermediate node N1 and the first pull-down unit 122.

Resistance of the first pull-down unit 122 may be determined by the second code CODE2 output by the second code generator 125. The second code generator 125 may include a second comparator 126 and a second counter 127, and the second comparator 126 may include a first input terminal connected to the first intermediate node N1, and a second input terminal receiving reference voltage VREF. The reference voltage VREF may be the same or substantially the same level of voltage as that of the reference voltage VREF described in the aforementioned example embodiment described with reference to FIG. 3.

The second counter 127 may generate the second code CODE2 with reference to an output of the second comparator 126, and may generate the second code CODE2 such that a voltage of the first intermediate node N1 may be equalized or substantially equalized to the reference voltage VREF. In other words, the second counter 127 may adjust the second code CODE2 such that resistance obtained by adding resistance of the first pull-down unit 122 determined by the second code CODE2 and resistance of the first coil L1 may be equalized or substantially equalized to resistance of the second pull-up unit 121 determined by the first code CODE1 and/or the shift code CODE1S. Accordingly, a resistive component of the first coil L1 may be reflected in resistance of the first pull-down unit 122 and in the second code CODE2.

For example, when resistance of the second pull-up unit 121 to which the first code CODE1 or the shift code CODE1S is input is defined as second pull-up resistance RUP2, resistance of the first coil L1 is defined as first coil resistance RL1, and resistance of the first pull-down unit 122 is defined as first pull-down resistance RDN1, equation 1 may be obtained. The reference voltage VREF may be desired (or, alternatively predetermined) to have a level of ½ of the first power supply voltage VDDQ.

$$\frac{VDDQ}{2} = \frac{(RL1 + RDN1)}{(RUP2 + RL1 + RDN1)} * VDDQ \qquad \text{[Equation 1]}$$

The second counter 127 may adjust the second code CODE2 such that the first pull-down unit 122 may have first pull-down resistance RDN1 which may satisfy equation 1. For example, resistance obtained by adding the first pull-down resistance RDN1 and the first coil resistance RL1 may be equal or substantially equal to the second pull-up resistance RUP2, and the first pull-down resistance RDN1 may be smaller than the second pull-up resistance RUP2. Accordingly, the second code generator circuit 120 may output the second code CODE2 in which a resistive component of the first coil L1 is reflected.

Figure 5A:
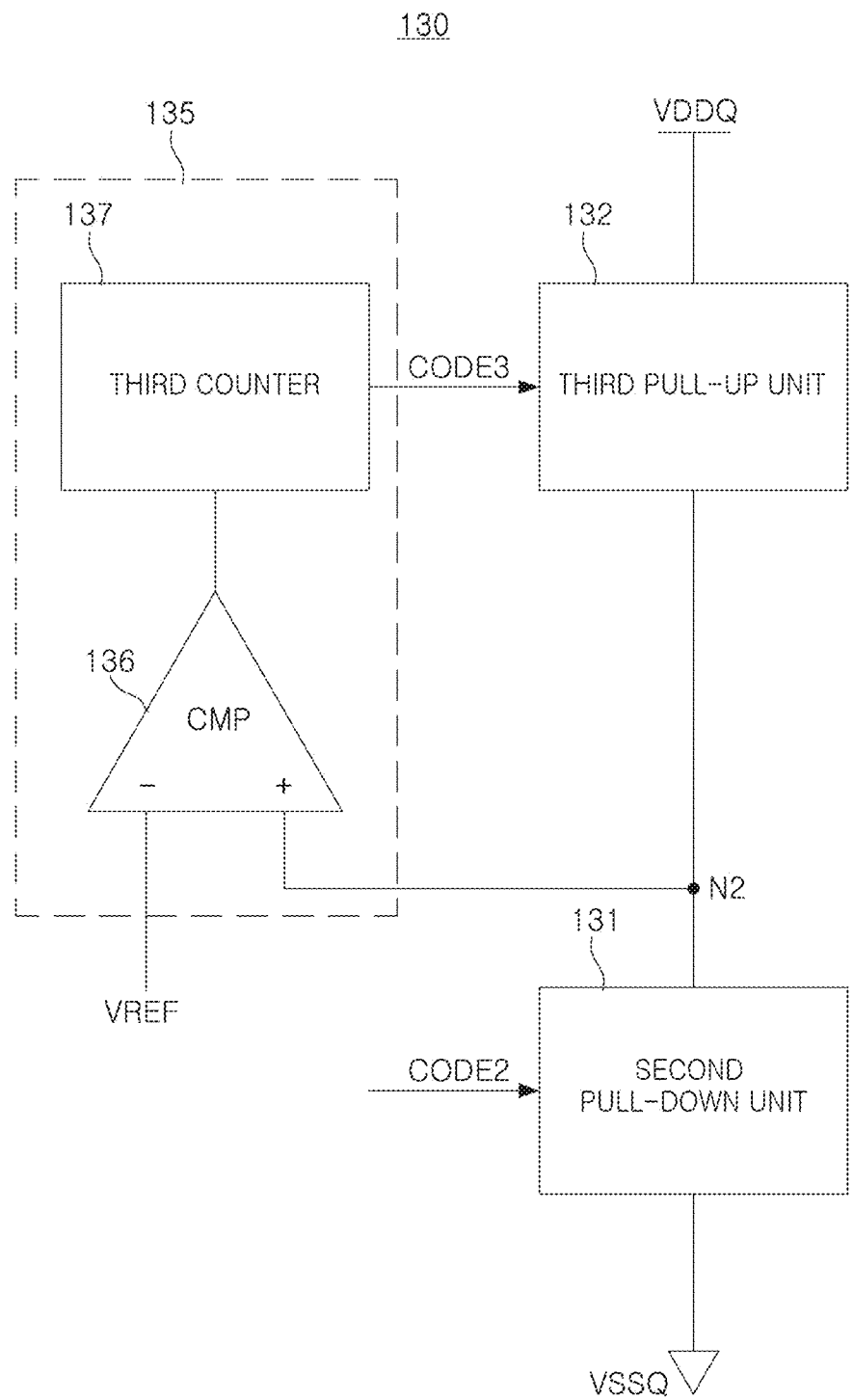
FIGS. 5A and 5B are circuit diagrams illustrating a third code generator circuit included in a calibration circuit according to an example embodiment of the inventive concepts.
Figure 5B:
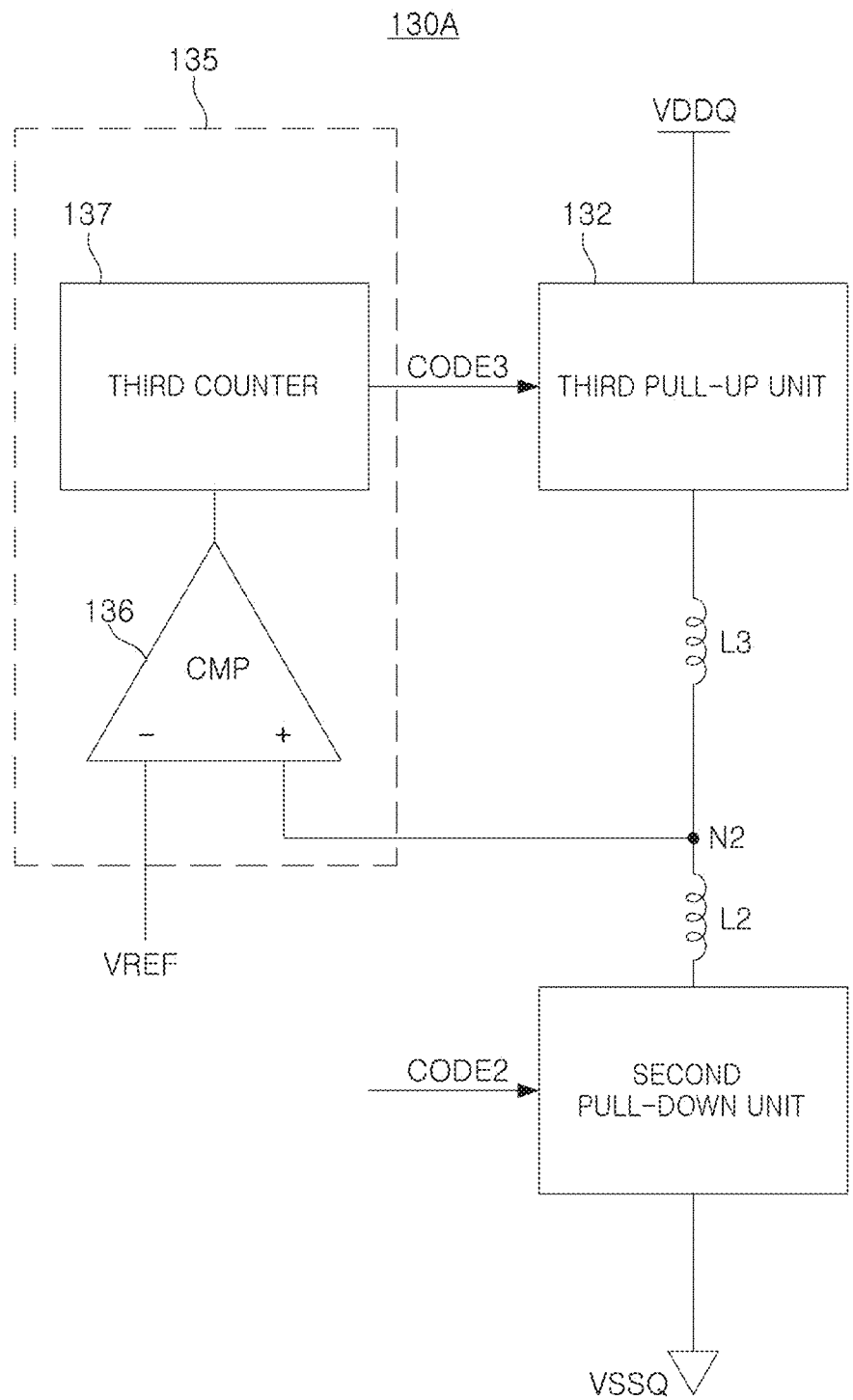

FIGS. 5A and 5B are circuit diagrams illustrating a third code generator circuit included in a calibration circuit according to an example embodiment.

Referring first to FIG. 5A, the third code generator circuit 130 in an example embodiment may include a second pull-down unit 131, a third pull-up unit 132, and a third code generator 135. The second pull-down unit 131 may receive the second power supply voltage VSSQ and may receive the second code CODE2. Resistance of the second pull-down unit 131 may be determined according to the second code CODE2, and for example, resistance of the second pull-down unit 131 may be equal or substantially equal to resistance of the first pull-down unit 122 described in the aforementioned example embodiment described with reference to FIG. 4.

A node to which the second pull-down unit 131 and the third pull-up unit 132 are connected may be defined as a second intermediate node N2, and the second intermediate node N2 may be connected to a first input terminal of the third comparator 136 included in a third code generator 135. The reference voltage VREF may be input to the second input terminal of the third comparator 136, and the reference voltage VREF may be determined to have a level of ½ of the first power supply voltage VDDQ (or a lesser or greater ratio of the first power supply voltage VDDQ).

The third counter 137 may adjust the third code CODE3 input to the third pull-up unit 132 such that the voltage of the second intermediate node N2 may be equalized or substantially equalized to the reference voltage VREF. Resistance of the third pull-up unit 132 may increase or decrease according to the third code CODE3, and for example, when resistance of the third pull-up unit 132 is equal or substantially equal to resistance of the second pull-down unit 131, the voltage of the second intermediate node N2 may be equal to the reference voltage VREF.

As described in the aforementioned example embodiment with reference to FIG. 4, the second code CODE2 may be determined by reflecting a resistive component of the first coil L1. Since resistance of the second pull-down unit 131 may be determined by the second code CODE2 to which a resistive component of the first coil L1 is reflected, and resistance of the second pull-up unit 132 may be determined according to resistance of the third pull-down unit 131, a resistive component of the first coil L1 may also be reflected in the third code CODE3 input to the third pull-up unit 132.

In some example embodiments, coils may also be connected to the second intermediate node N2. Referring to FIG. 5B, the second coil L2 and the third coil L3 may be connected to the second intermediate node N2 in the third code generator circuit 130A. The second coil L2 may be connected between the second intermediate node N2 and the second pull-down unit 131, and the third coil L3 may be connected between the second intermediate node N2 and the third pull-up unit 132. Inductance of each of the second coil L2 and the third coil L3 may be the same or substantially the same as that of the first coil L1. In other words, each of the second coil L2 and the third coil L3 may be implemented as a duplicate coil having the same or substantially the same inductance as that of a coil connected between a transmitter and/or a receiver of an input/output circuit and a pad in a semiconductor device.

In the example embodiment illustrated in FIG. 5B, since resistance of the second pull-down unit 131 is determined by the second code CODE2, resistance of the second pull-down unit 131 may be equal or substantially equal to the first pull-down unit 122 described in the aforementioned example embodiment described with reference to FIG. 4. Also, since the second coil L2 and the third coil L3 may have the same or substantially the same inductance, resistance of the second coil L2 may be equal or substantially equal to resistance of the third coil L3. Accordingly, in the example embodiment illustrated in FIG. 5B, the third code CODE3 generated by the third counter 137 may be a digital code as in the aforementioned example embodiment described with reference to FIG. 5A.

Figure 6A:
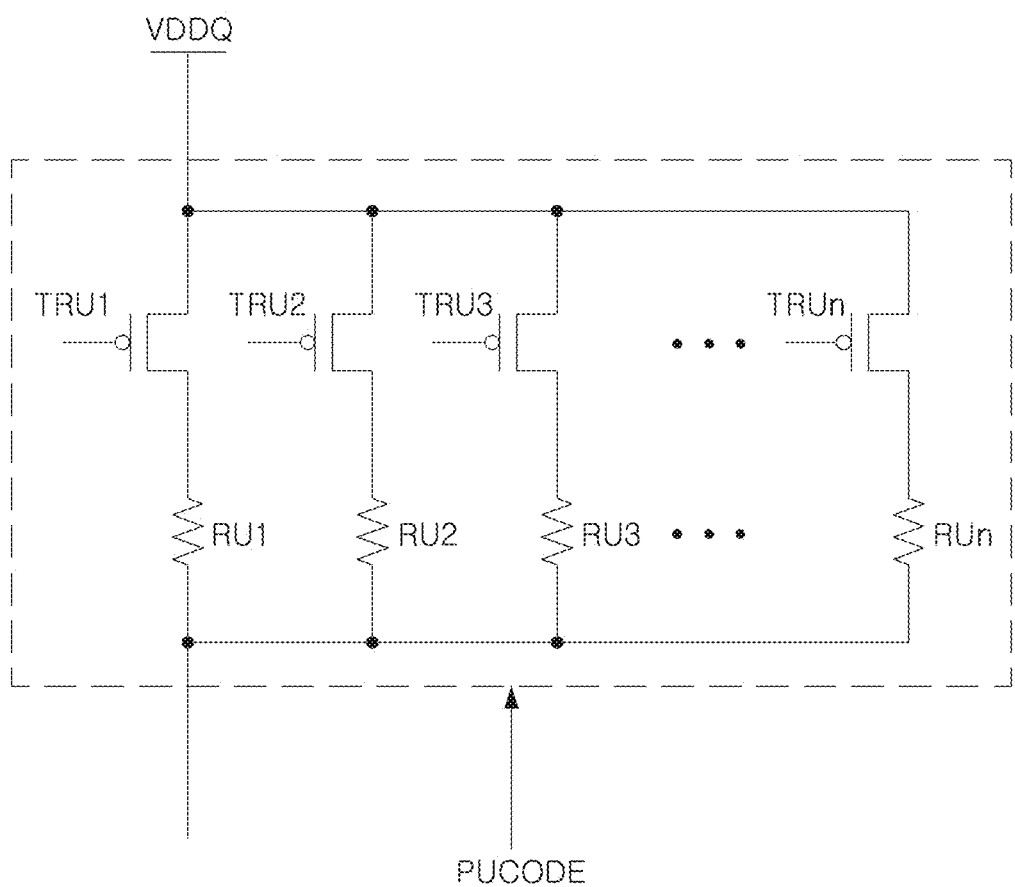
FIGS. 6A and 6B are circuit diagrams illustrating a pull-up unit and a pull-down unit included in a calibration circuit according to an example embodiment of the inventive concepts.
Figure 6B:
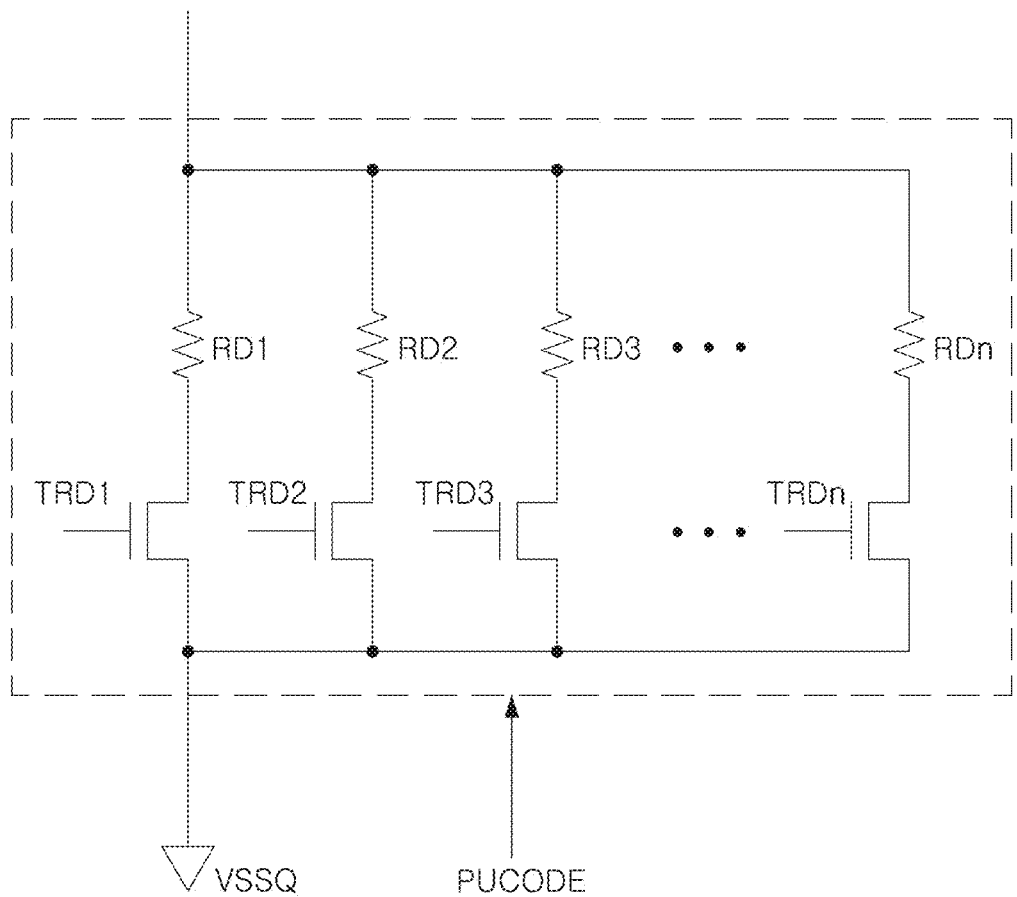

FIGS. 6A and 6B are circuit diagrams illustrating a pull-up unit and a pull-down unit included in a calibration circuit according to an example embodiment.

FIG. 6A may be configured as a circuit diagram illustrating a pull-up unit 200. Referring to FIG. 6A, the pull-up unit 200 may include a plurality of unit resistors RU1, RU2, RU3-RUn and a plurality of unit switches TRU1, TRU2, TRU3-TRUn. Each of the plurality of unit resistors RU1-RUn may be connected to one of the plurality of unit switches TRU1-TRUn in series.

Resistance of the pull-up unit 200 may be determined by a pull-up code PUCODE. The pull-up code PUCODE may be implemented as a digital code having a number of bits corresponding to the number of the plurality of unit switches TRU1-TRUn included in the pull-up unit 200. In the example embodiment illustrated in FIG. 6A, the pull-up code PUCODE may be configured as an n-bit digital code. The plurality of unit switches TRU1-TRUn may be connected to a first power supply node supplying the first power supply voltage VDDQ. The plurality of unit resistors RU1-RUn may have the same level of resistance or different levels of resistance.

FIG. 6B may be a circuit diagram illustrating a pull-down unit 210. Referring to FIG. 6B, the pull-down unit 210 may have a structure similar to that of the pull-up unit. For example, the pull-down unit 210 may include a plurality of unit resistors RD1, RD2, RD3-RDn and a plurality of unit switches TRD1, TRD2, TD3-TRDn. Each of the plurality of unit resistors RD1 to RDn may be connected to one of the plurality of unit switches TRD1-TRDn in series. The plurality of unit switches TRD1-TRDn may be connected to a second power supply node supplying the second power supply voltage VSSQ.

Resistance of the pull-down unit 210 may be determined by a pull-down code PDCODE. The pull-down code PDCODE may be implemented as a digital code having a number of bits corresponding to the number of the plurality of unit switches TRD1-TRDn. In the example embodiment illustrated in FIG. 6B, the plurality of unit resistors RD1-RDn may have the same level of resistance or different levels of resistance.

Figure 7:
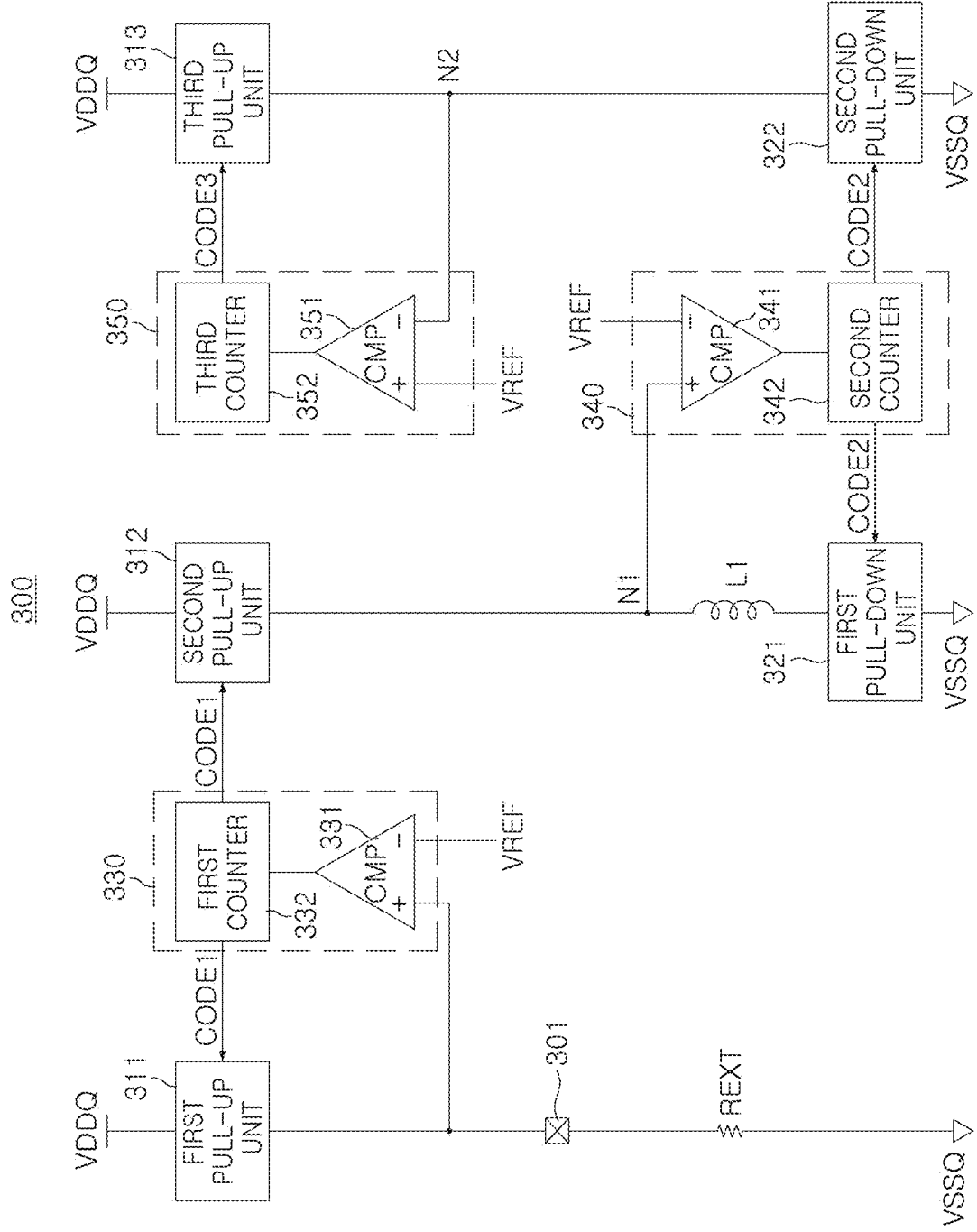
FIGS. 7, 8 and 9 are circuit diagrams illustrating a calibration circuit according to an example embodiment of the inventive concepts.
Figure 8:
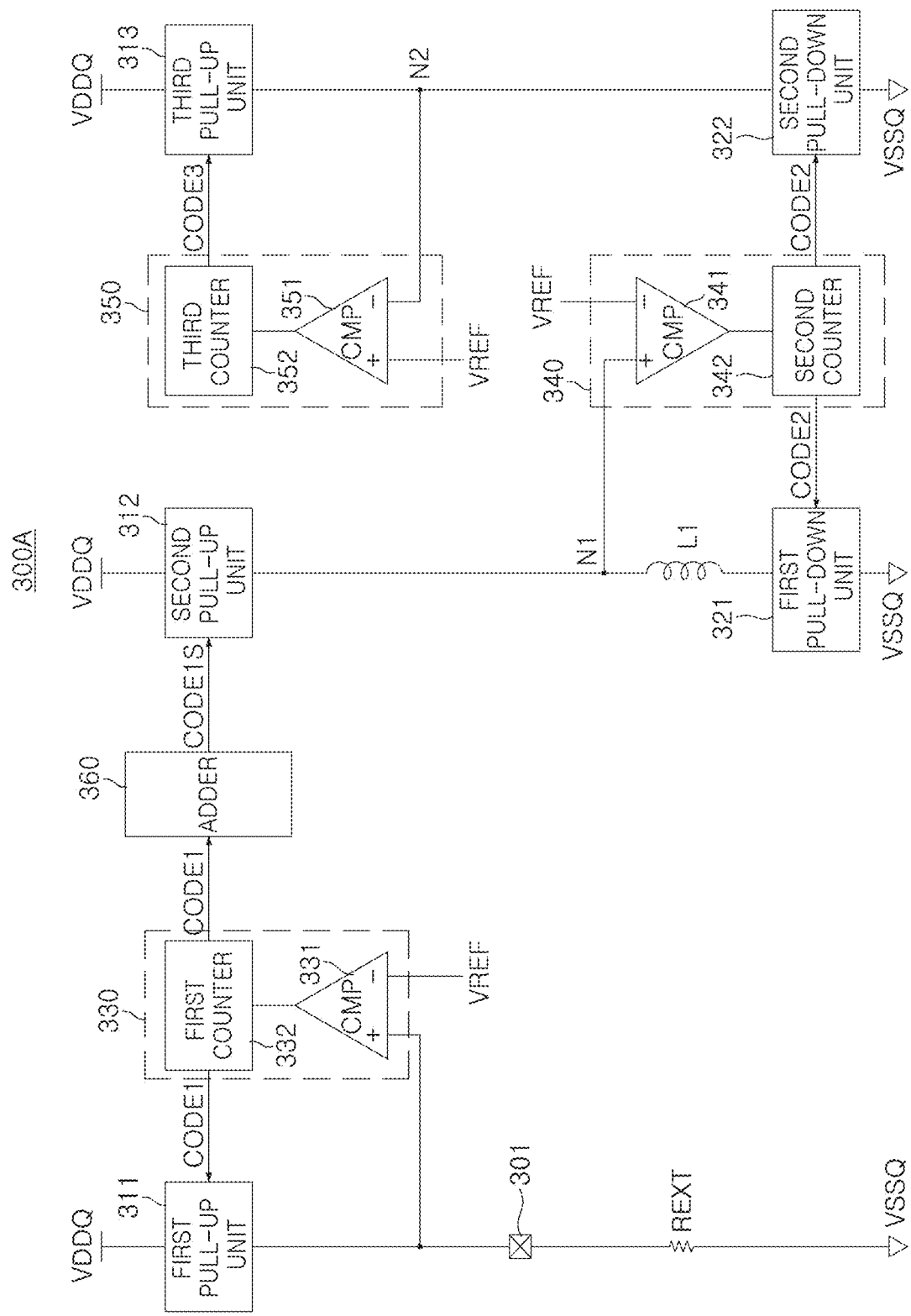
Figure 9:
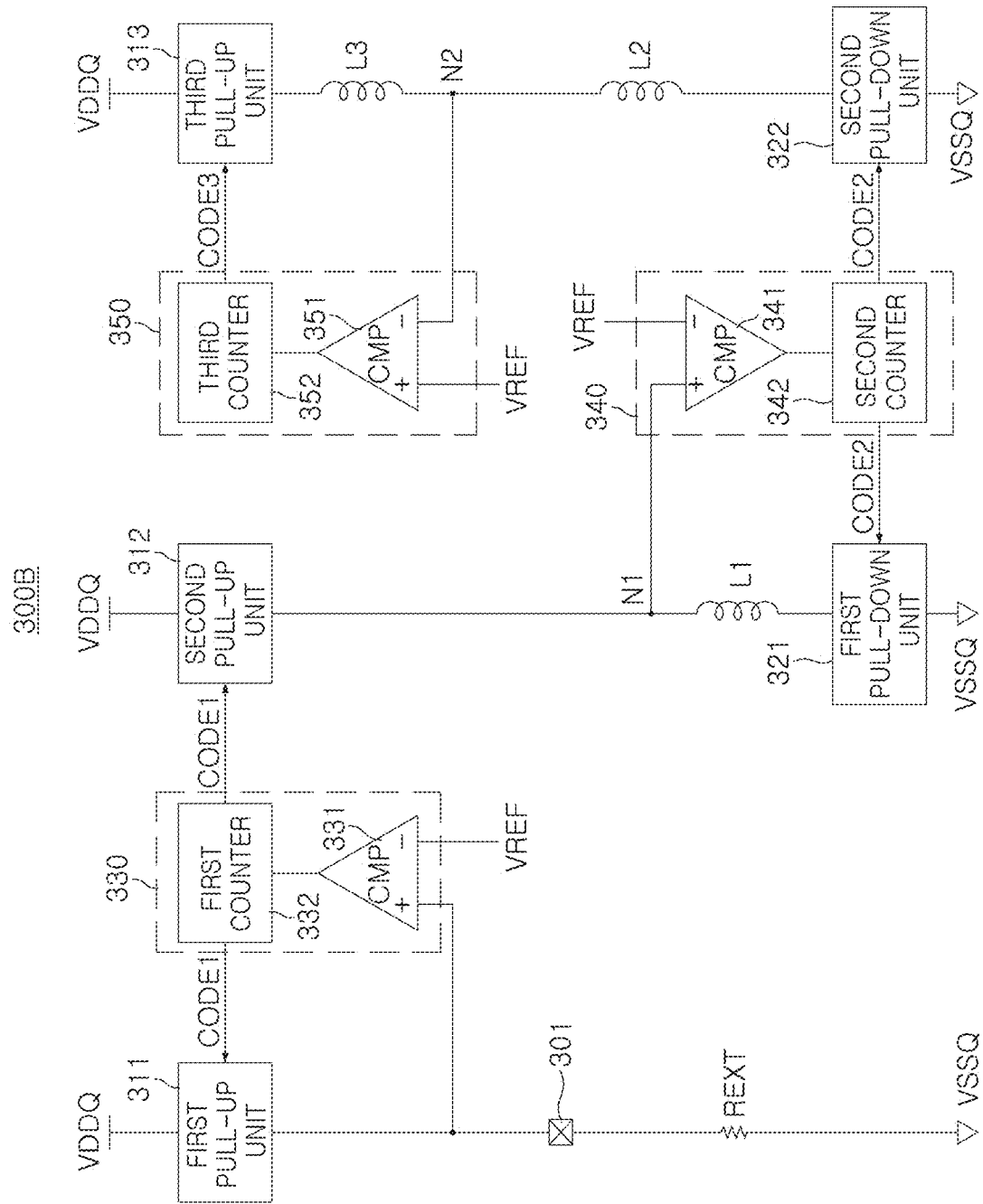

FIGS. 7 to 9 are circuit diagrams illustrating a calibration circuit according to an example embodiment.

Referring to FIG. 7, a calibration circuit 300 in an example embodiment may include a first pull-up unit 311, a second pull-up unit 312, a third pull-up unit 313, a first pull-down unit 321, a second pull-down unit 322, a first code generator 330, a second code generator 340, a third code generator 350, and a first coil L1. Each of the first to third pull-up units 311-313 may receive a first power supply voltage VDDQ, and each of the first and second pull-down units 321 and 322 may receive a second power supply voltage VSSQ.

The first pull-up unit 311 may be connected to an external resistor device REXT through the pad 301. The external resistor device REXT may be configured as a passive device and may provide resistance not affected by the semiconductor device including the calibration circuit 300. The first code generator 330 may include a first comparator 331 and a first counter 332, and the first counter 332 may adjust the first code CODE1 such that a voltage of the pad 301 distributed by the first pull-up unit 311 and the external resistor device REXT may be equalized to a reference voltage VREF. For example, the reference voltage VREF may be desired (or, alternatively predetermined) to have a level of ½ of a level of the first power supply voltage VDDQ (or a lesser or greater ratio of the first power supply voltage VDDQ). In this case, when the adjustment of the first code CODE1 is completed, the first pull-up unit 311 may have the same or substantially the same level of resistance as that of the external resistor device REXT.

When the adjustment of the first code CODE1 is completed, the first code generator 330 may output the first code CODE1 to the second pull-up unit 312. The second pull-up unit 312 may be determined to have a level of resistance corresponding to the first code CODE1.

However, in some example embodiments, the first code CODE1 may not be directly input to the second pull-up unit 312. For example, the semiconductor device including the calibration circuit 300 may include a plurality of pads, and the plurality of pads may include a first pad transmitting/receiving a first signal and a second pad receiving a second signal. For example, the first signal may be transmitted/received at a first rate through the first pad, and the second signal may be received at a second rate slower than the first rate in the second pad. In this case, the pad 301 illustrated in FIGS. 7 to 9 may be defined as a third pad different from the first pad and the second pad.

In the some example embodiments, resistance to be connected to the first pad for impedance matching may be different from resistance to be connected to the second pad. For example, resistance to be connected to the first pad for impedance matching may be different from the external resistor device REXT, and resistance to be connected to the second pad may be the same or substantially the same as the external resistor device REXT.

When resistance to be connected to the first pad is different from resistance to be connected to the second pad, the first code CODE1 may not be directly input to the second pull-up unit 312. Referring to FIG. 8, a circuit shifting a digital code, such as an adder 360, may be connected between the first counter 332 and the second pull-up unit 312. The adder 360 may provide the shift code CODE1S obtained by shifting the first code CODE1 to second pull-up unit 312, and the operation of shifting the first code CODE1 performed by the adder 360 may be determined according to a difference between resistance to be connected to the first pad and resistance to be connected to the second pad.

When resistance of the second pull-up unit 312 is determined according to the first code CODE1 or the shift code CODE1S, the second code generator 340 may adjust the second code CODE2. For example, the second counter 342 of the second code generator 340 may generate a second code CODE2 such that a voltage of the first intermediate node N1 input to the second comparator 341 may be equalized or substantially equalized to the reference voltage VREF. As illustrated in FIGS. 7 and 8, the first pull-down unit 321 having resistance determined by the second code CODE2 may be connected to the first intermediate node N1 through the first coil L1.

Accordingly, when the adjustment of the second code CODE2 is completed such that the voltage of the first intermediate node N1 is equalized or substantially equalized to the reference voltage VREF, a resistive component of the first coil L1 may be reflected in the second code CODE2. For example, resistance obtained by adding resistance of the first pull-down unit 321 and resistance of the first coil L1 by the second code CODE2 may be equal to resistance of the second pull-up unit 312 by the first code CODE1 or the shift code CODE1S.

The second code CODE2 may be provided to both the first pull-down unit 321 and the second pull-down unit 322. The second pull-down unit 322 may provide resistance corresponding to the second code CODE2, such that resistance of the second pull-down unit 322 may be determined to be equal or substantially equal to resistance of the first pull-down unit 321.

The second pull-down unit 322 may be connected to the third pull-up unit 313 through the second intermediate node N2, and the second intermediate node N2 may be connected to the third code generator 350. Referring to FIGS. 7 and 8, the second intermediate node N2 may be input to the third comparator 351, and the third comparator 351 may compare the voltage of the second intermediate node N2 with the reference voltage VREF. The third counter 352 may adjust resistance of the third pull-up unit 313 by adjusting the third code CODE3, until the voltage of the second intermediate node N2 is equalized or substantially equalized to the reference voltage VREF.

For example, the reference voltage VREF may be desired (or, alternatively predetermined) to a ½ level of the first power supply voltage VDDQ (or a lesser or greater ratio of the first power supply voltage VDDQ), such that, when resistance of the third pull-up unit 313 is equal or substantially equal to resistance of the second pull-down unit 322, the voltage of the second intermediate node N2 may be equalized or substantially equalized to the reference voltage VREF. As described above, the second code CODE2 may be generated to reflect a resistive component of the first coil L1, and accordingly, a resistive component of the first coil L1 may also be reflected in the third code CODE3.

Referring to FIG. 9, a calibration circuit 300B in an example embodiment may include a first pull-up unit 311, a second pull-up unit 312, a third pull-up unit 313, a first pull-down unit 321, a second pull-down unit 322, a first code generator 330, a second code generator 340, a third code generator 350, and a first coil L1. Each of the first to third pull-up units 311-313 may receive a first power supply voltage VDDQ, and each of the first and second pull-down units 321 and 322 may receive a second power supply voltage VSSQ.

In the calibration circuit 300B according to an example embodiment illustrated in FIG. 9, operations of the first pull-up unit 311, the first code generator 330, the second pull-up unit, the first pull-down unit 321 and the second code generator 340 may be similar to those in the aforementioned example embodiment described with reference to FIGS. 7 and 8. However, referring to FIG. 9, the calibration circuit 300B may further include a second coil L2 and a third coil L3 connected to the second intermediate node N2. The second coil L2 may be connected between the second intermediate node N2 and the second pull-down unit 322, and the third coil L3 may be connected between the second intermediate node N2 and the third pull-up unit 313.

Each of the second coil L2 and the third coil L3 may have the same or substantially the same inductance as that of the first coil L1. When the second code generator 340 determines the second code CODE2 by reflecting a resistive component of the first coil L1, the second pull-down unit 322 may be determined to have the same or substantially the same level of resistance as that of the first pull-down unit 321. When the third code generator 350 completes the adjustment of the third code CODE3 such that the voltage of the second intermediate node N2 is equalized or substantially equalized to the reference voltage VREF, resistance of the third pull-up unit 313 may be equal or substantially equal to resistance of the second pull-down unit 322. In other words, the third code generator 350 may adjust the third code CODE3 such that the third pull-up unit 313 may have the same or substantially the same level of resistance as that of the second pull-down unit 322.

Each of the calibration circuits 300, 300A, and 300B according to the example embodiments described with reference to FIGS. 7 to 9 may output first to third codes CODE1-CODE3. For example, the first to third codes CODE1-CODE3 may be transmitted to an input/output circuit of a semiconductor device including at least one of the calibration circuits 300, 300A, and 300B, and may be applied to determining pull-up resistance and/or pull-down resistance connected to pads in an input/output circuit.

For example, in a semiconductor device, a receiver may be connected to each of a plurality of pads, and a transmitter may be connected to a portion of pads together with a receiver. Assuming that the semiconductor device is configured as a memory device, the first code CODE1 may be input to a pad to which a receiver is connected, such as, for example, a pull-up unit connected to a pad for receiving a command/address signal, and may be applied to determining pull-up resistance. The second code CODE2 and the third code CODE3 may be input to a pull-down unit and a pull-up unit, respectively, connected to a pad to which a transmission coil for compensating for a parasitic component is connected, that is, for example, a pad for inputting and outputting a data signal or a pad for receiving a data clock signal. Inductance of the transmission coil may be the same or substantially the same as inductance of the first coil L1 in each of the calibration circuits 300, 300A, and 300B described above.

Figure 10:
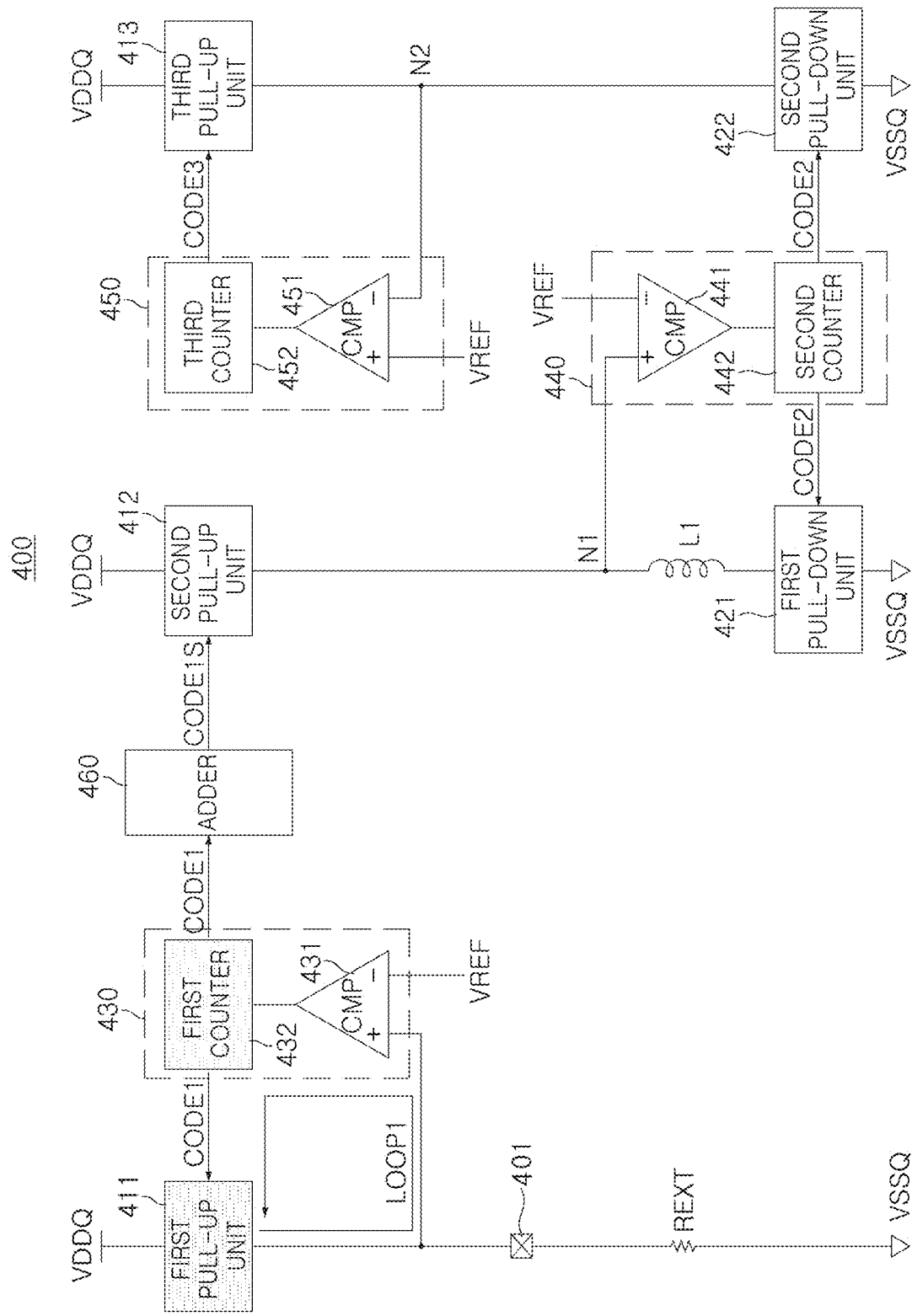
FIGS. 10, 11 and 12 are diagrams illustrating operations of a calibration circuit according to an example embodiment of the inventive concepts.
Figure 11:
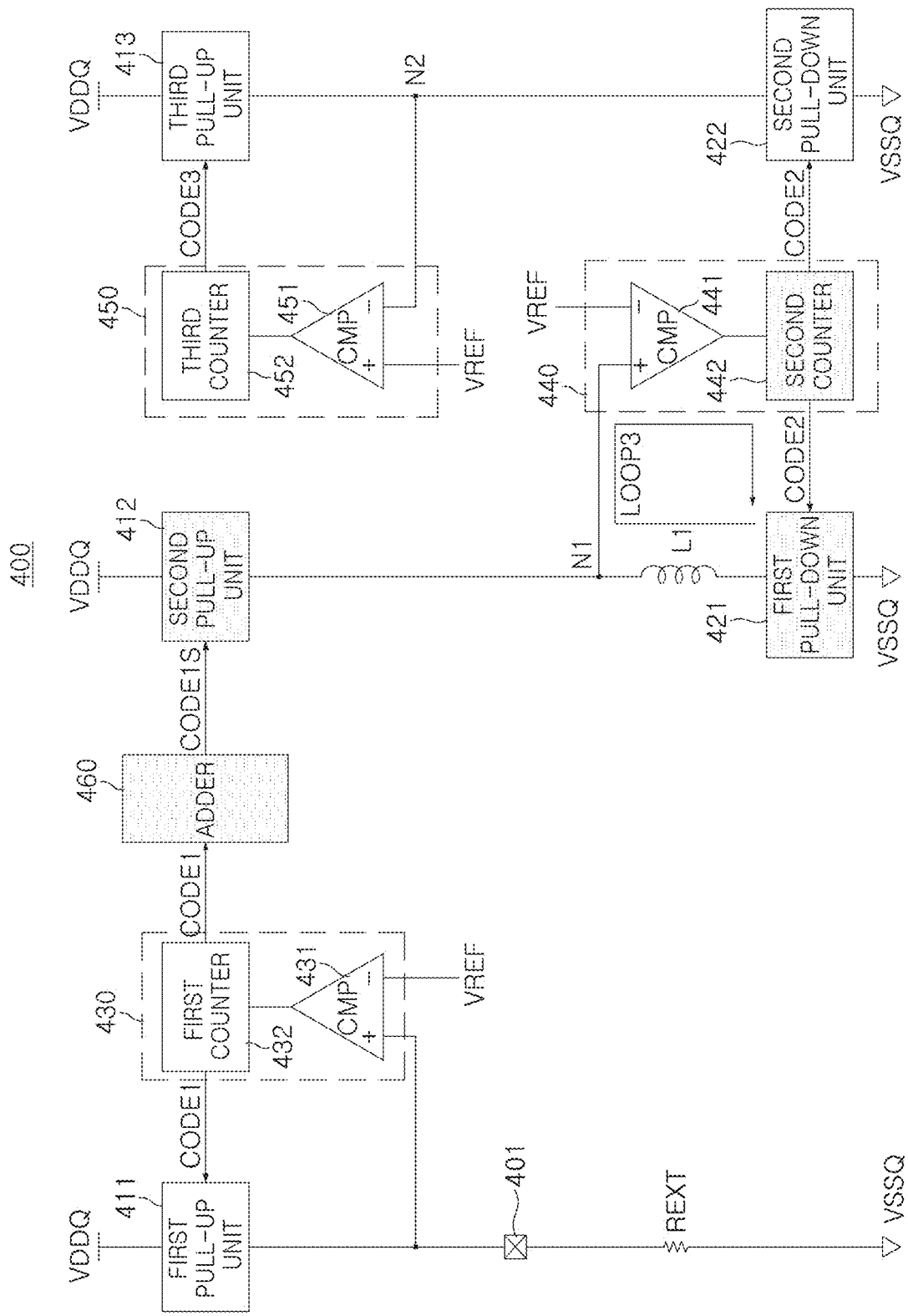
Figure 12:
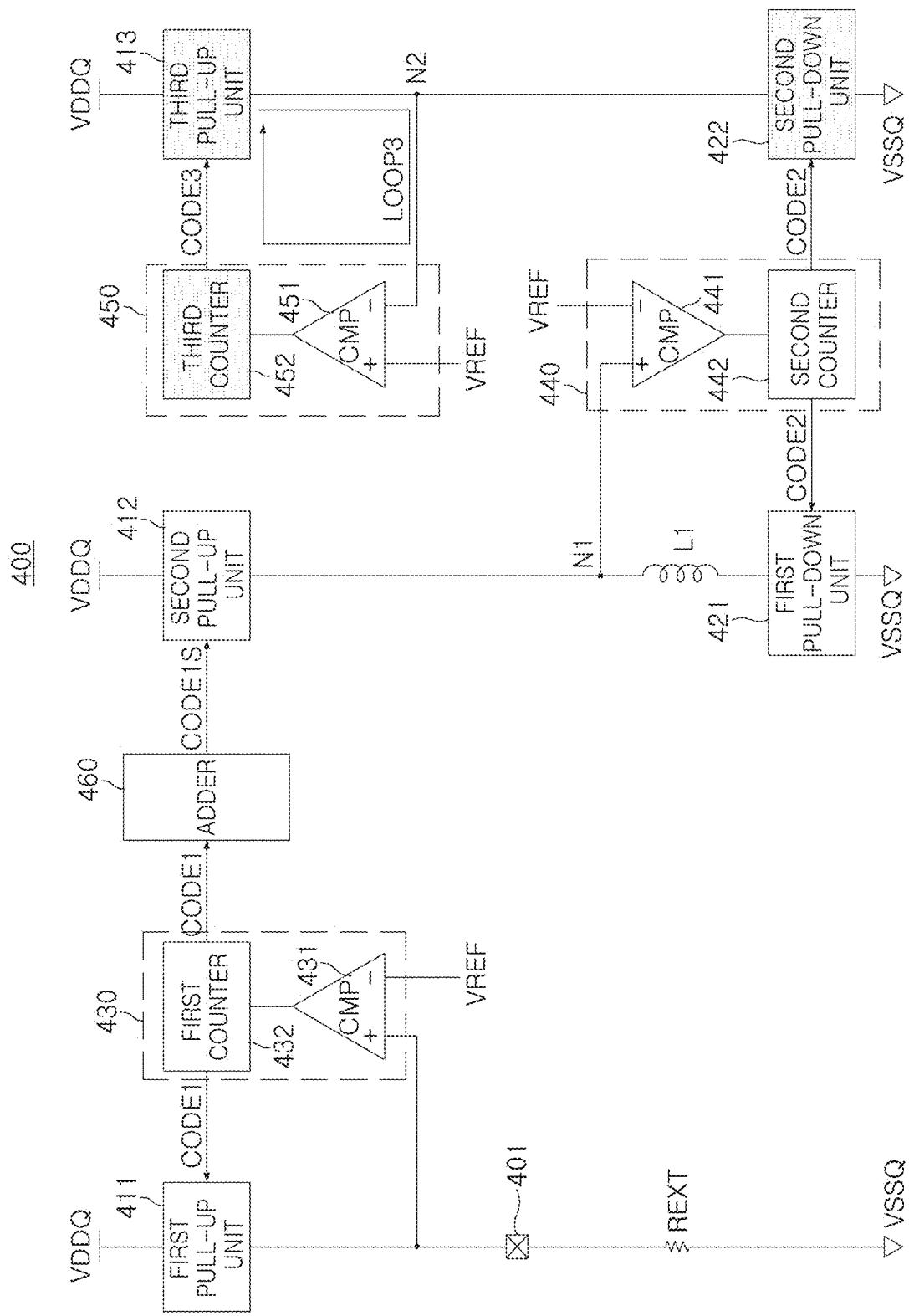

FIGS. 10 to 12 are diagrams illustrating operations of a calibration circuit according to an example embodiment.

Referring to FIGS. 10 to 12, a calibration circuit 400 in an example embodiment may include first to third pull-up units 411-413, first and second pull-down units 421 and 422, a first code generator 430, a second code generator 440, a third code generator 450, an adder 460, and a first coil L1. Each of the first to third pull-up units 411-413 may receive a first power supply voltage VDDQ, and each of the first and second pull-down units 421 and 422 may receive a second power supply voltage VSSQ.

When the semiconductor device including the calibration circuit 400 starts a ZQ calibration operation in response to a command from an external host, a first calibration operation using the first loop LOOP1 may start. In the first calibration operation, the first code generator 430 may adjust the first code CODE1 such that the first pull-up unit 411 may have the same or substantially the same level of resistance as that of the external resistor device REXT connected to the pad 401. A first input terminal of the first comparator 431 may be connected to the pad 401, and a second input terminal may receive the reference voltage VREF. The first counter 432 may adjust the first code CODE1 until the voltage of the pad 401 is equalized or substantially equalized to the reference voltage VREF.

When the adjustment of the first code CODE1 is completed, the adder 460 connected to the first counter 432 may shift the first code CODE1 and may generate the shift code CODE1S. In some example embodiments, the adder 460 may be replaced with other various circuits converting a digital code.

Resistance of the second pull-up unit 412 may be determined by the shift code CODE1S. For example, the second pull-up unit 412 may be determined to be 1/N times resistance of the first pull-up unit 411 (N is a natural number equal to or greater than 2). When resistance of the second pull-up unit 412 is determined, a second calibration operation using the second loop LOOP2 may start. The second counter 442 may adjust the second code CODE2 until the voltage of the first intermediate node N1 input to the second comparator 441 is equalized or substantially equalized to the reference voltage VREF.

The second code CODE2 may also be input to the second pull-down unit 422. When the voltage of the first intermediate node N1 is equalized to the reference voltage VREF, the second code CODE2 may be input to the second pull-down unit 422. Accordingly, resistance of the second pull-down unit 422 may be equalized to resistance of the first pull-down unit 421. When resistance of the second pull-down unit 422 is determined to have the same level of resistance as that of the first pull-down unit 421, the third calibration operation using the third loop LOOP3 may start as illustrated in FIG. 12.

In the third calibration operation, the third counter 452 may adjust resistance of the pull-up unit 413 such that the voltage of the second intermediate node N2 input to the third comparator 451 is equalized or substantially equalized to the reference voltage VREF. For example, the third counter 452 may change resistance of the third pull-up unit 413 by adjusting the third code CODE3 input to the third pull-up unit 413.

When the third calibration operation is completed, the calibration circuit 400 may output the first to third codes CODE1 to CODE3 and may determine resistance of pull-up units and pull-down units connected to pads of the semiconductor device. The pull-down resistance and pull-up resistance of a pad to which the transmission coil having the same or substantially the same inductance as that of the first coil L1 is connected may be determined according to the second code CODE2 and the third code CODE3, respectively, and the pull-up resistance of a pad to which the transmission coil is not connected may be determined according to the first code CODE1. Accordingly, the pull-up resistance and the pull-down resistance which may be connected to the pads for impedance matching may be precisely adjusted in the ZQ calibration operation regardless of whether the transmission coil is connected, and performance of the semiconductor device including the calibration circuit 400 may improve.

Figure 13:
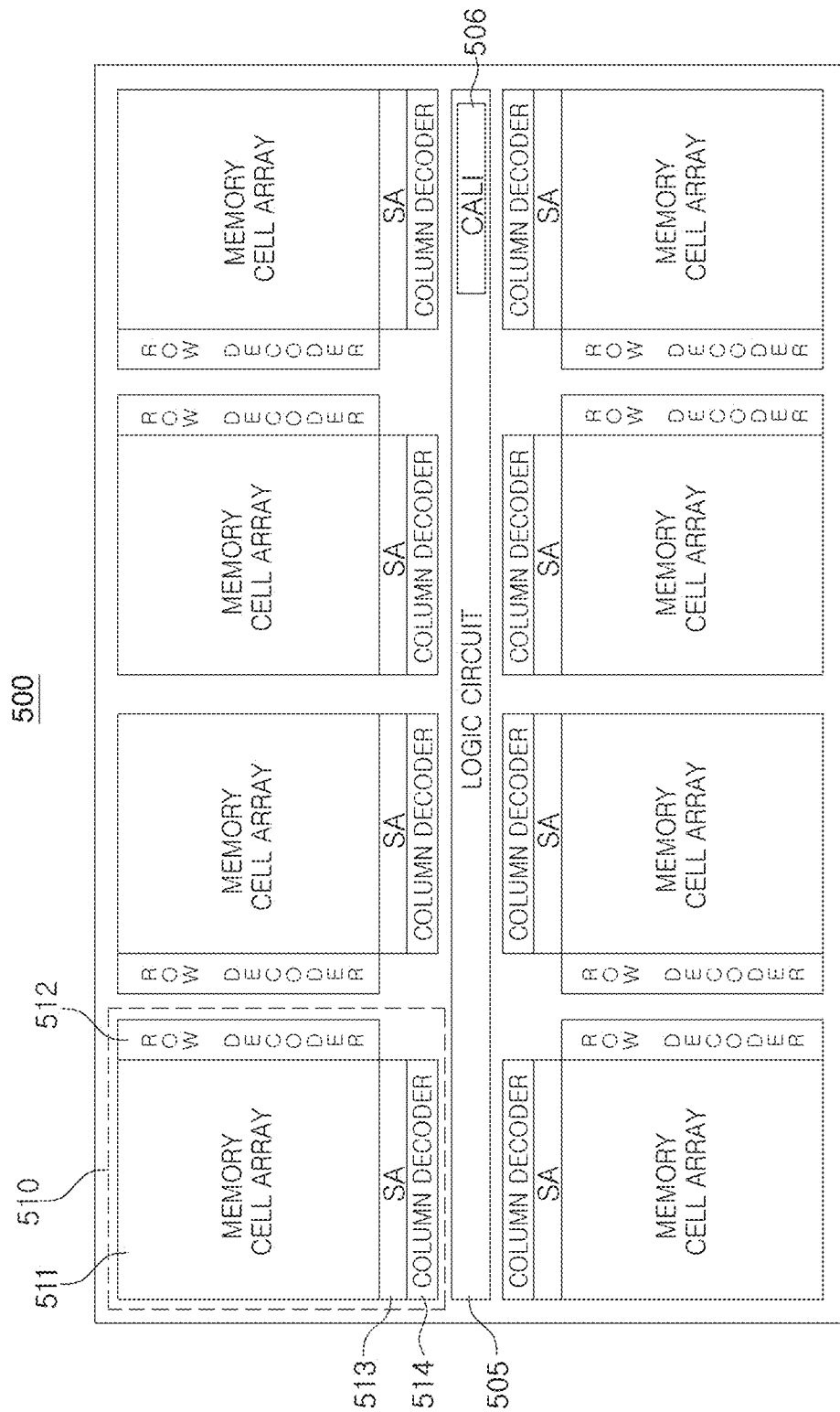
FIGS. 13 and 14 are diagrams illustrating a semiconductor device according to an example embodiment of the inventive concepts.
Figure 14:
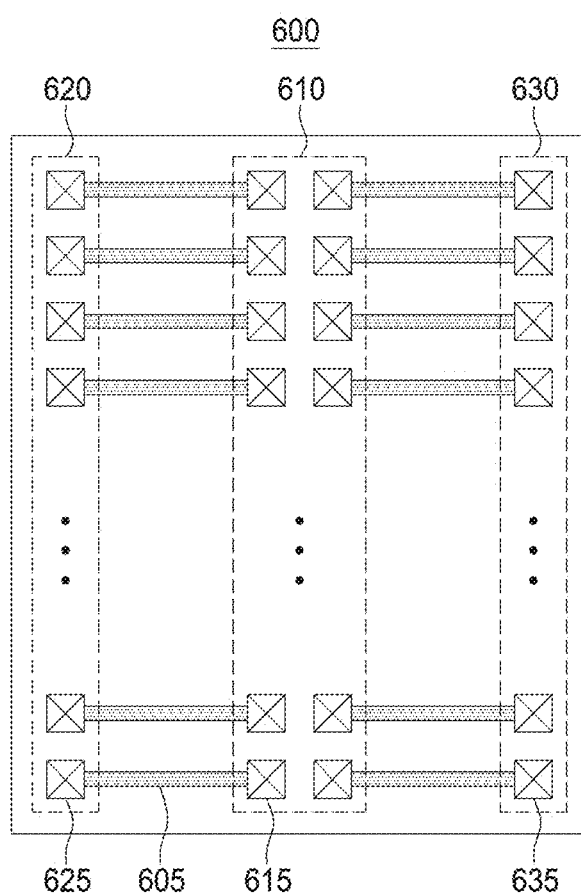

FIGS. 13 and 14 are diagrams illustrating a semiconductor device according to an example embodiment.

Referring to FIG. 13, a semiconductor device 500 may be configured as a memory device and may include a plurality of unit memory regions 510. For example, when the semiconductor device 500 is implemented as a dynamic random access memory (DRAM), the unit memory region 510 may be defined as a memory bank. Each of the plurality of unit memory regions 510 may include a memory cell array 511, a row decoder 512, a sense amplifier circuit 513, and a column decoder 514.

The operation of the semiconductor device 500 may be controlled by the logic circuit 505. The logic circuit 505 store data received from an external entity in at least one of the plurality of unit memory regions 510, or may read data from at least one of the plurality of unit memory regions 510 based on address information received from an external entity and may output the data to an external entity.

Also, the logic circuit 505 may include an input/output circuit for transmitting signals to and receiving signals from an external device. Since the plurality of unit memory regions 510 are disposed on both sides of the logic circuit 505, the logic circuit 505 may be disposed in a center region of the semiconductor device 500. Accordingly, by forming the semiconductor device 500 in a center pad structure in which pads are disposed in the center thereof, wiring patterns connecting the input/output circuit of the logic circuit 505 to the pads may be efficiently designed.

In some example embodiments, at least one of wiring patterns connecting the input/output circuit to the pads may include a transmission coil providing desired (or, alternatively predetermined) inductance. The transmission coil may be implemented in various shapes, and may improve integrity of a signal transmitted and received through the pads by reducing or canceling influence of a parasitic component present in the wiring patterns.

The logic circuit 505 may include a calibration circuit 506. The calibration circuit 506 may perform a ZQ calibration operation in response to a command received by the semiconductor device 500 from an external host. For example, the ZQ calibration operation may be an operation of reducing an impedance mismatch of the semiconductor device 500 by adjusting pull-up resistance and/or pull-down resistance connected to each of the pads.

At least one of the wiring patterns connecting the input/output circuit to the pads may include a transmission coil, and in this case, due to a resistive component of the transmission coil, when pull-up resistance and pull-down resistance are adjusted to be resistance as defined in a specification, impedance mismatch may increase. Accordingly, in some example embodiments, a coil duplicating the transmission coil may be included in the calibration circuit 506, and a ZQ calibration operation reflecting a resistive component of the transmission coil may be performed using the coil.

Referring to FIG. 14, the semiconductor device 600 may have a center pad structure in which center pads 615 are disposed in a center region 610. The center pads 615 may be connected to the edge pads 625 and 635 disposed in the edge regions 620 and 630 of the semiconductor device 600 by a redistribution layer 605.

The semiconductor device 600 may include a plurality of circuit devices formed on a semiconductor substrate and a plurality of wiring patterns connected to the plurality of circuit devices. The plurality of wiring patterns may connect a plurality of circuit devices to each other or may connect the plurality of circuit devices to the center pads 615.

As described in the aforementioned example embodiment with reference to FIG. 13, at least one of the wiring patterns connecting the input/output circuit included in the logic circuit 505 to the center pads 615 may provide a transmission coil for compensating for influence of a parasitic component. For example, a transmission coil may be connected to a pad inputting/outputting a signal at a relatively high speed among the center pads 615. The transmission coil may be implemented in wiring patterns connecting the center pads 615 to the input/output circuit, or in the redistribution layer 606.

Figure 15:
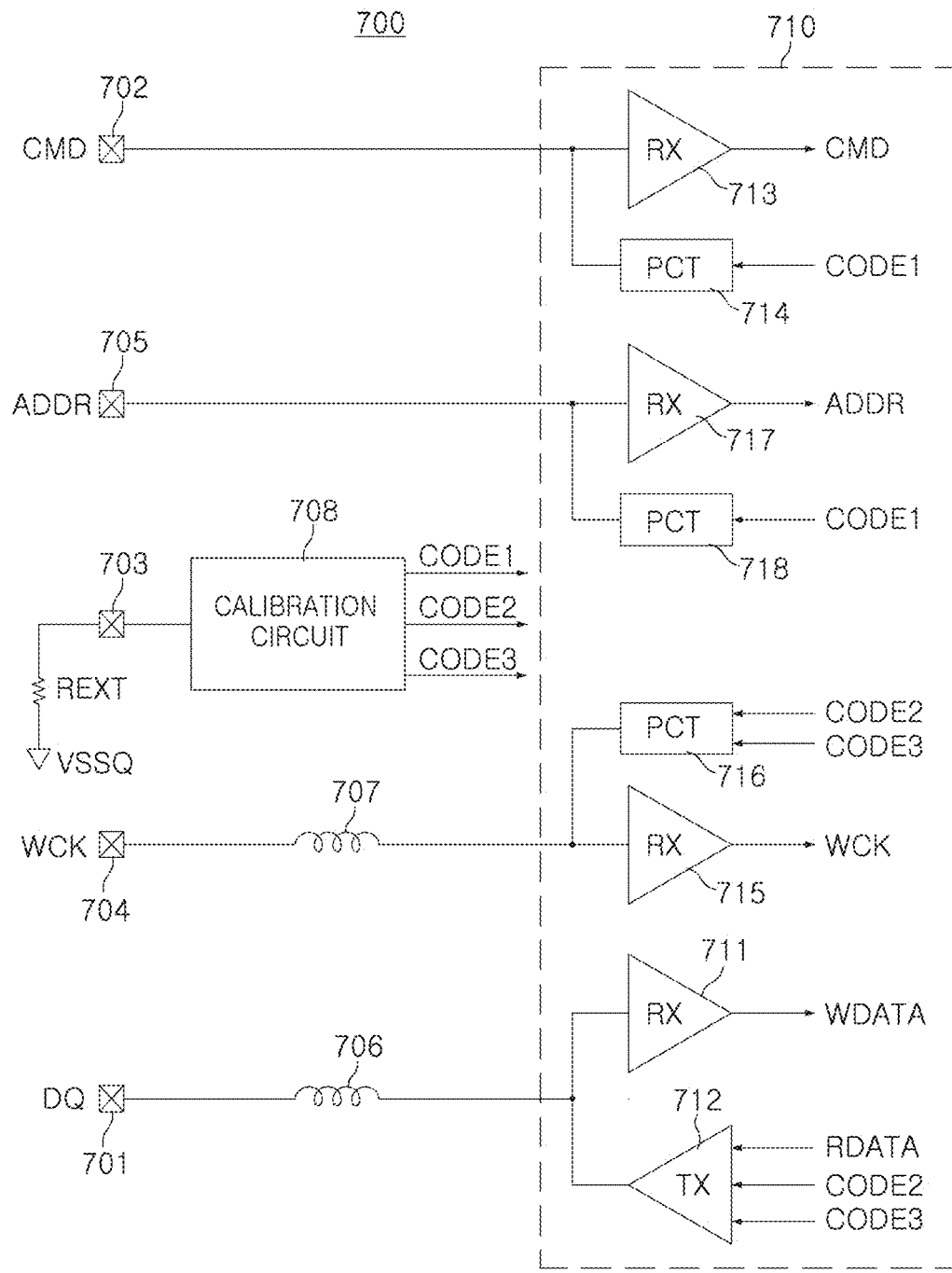
FIGS. 15 and 16 are diagrams illustrating operations of a semiconductor device according to an example embodiment of the inventive concepts.
Figure 16:
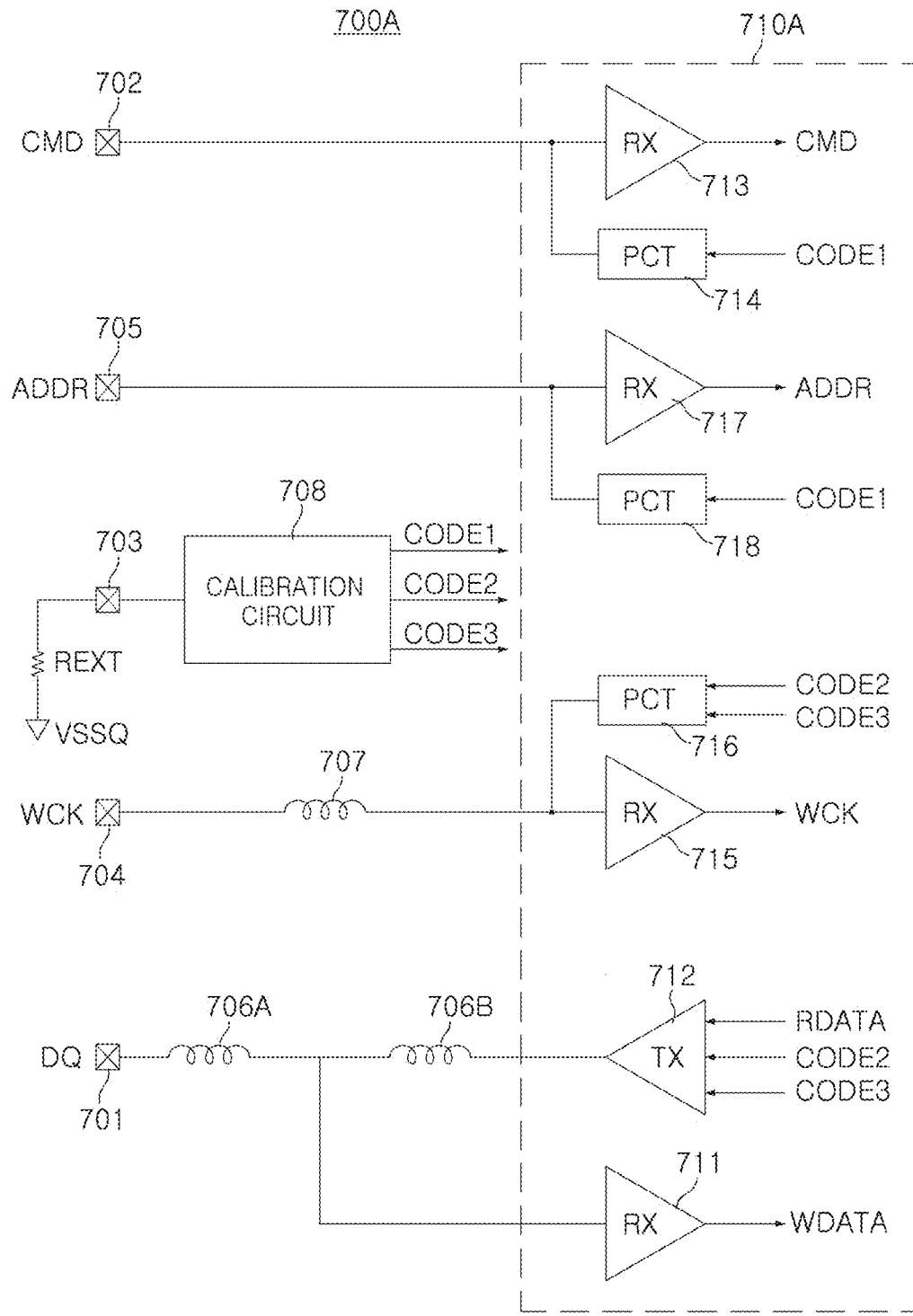

FIGS. 15 and 16 are diagrams illustrating operations of a semiconductor device according to an example embodiment.

Referring first to FIG. 15, a semiconductor device 700 may include a plurality of pads 701-705, a calibration circuit 708, and an input/output circuit 710. The input/output circuit 710 may receive or transmit a signal through at least a portion of the plurality of pads 701-705. The calibration circuit 708 may be connected to an external resistor device REXT not affected by operation of the semiconductor device 700 through at least one of the plurality of pads 701-705, and may perform a ZQ calibration operation determining resistance required for impedance matching.

Among the plurality of pads 701-705, the first pad 701 may be configured to transmit and receive a first signal DQ at a first speed, and in the example embodiment illustrated in FIG. 15, the first signal DQ may be configured as a data signal. The second pad 702 may be configured to receive the second signal CMD at a second speed slower than the first speed, and the second signal CMD may be configured as a command signal. When the semiconductor device 700 is implemented as a memory device, the second signal CMD may be configured as a write enable signal. a read enable signal, etc.

The third pad 703 may be connected to the external resistor device REXT implemented externally of the semiconductor device 700, and may be connected to the calibration circuit 708 within the semiconductor device 700. The calibration circuit 708 may be implemented according to at least one of the aforementioned example embodiments described with reference to FIGS. 7 to 12, and may output the first to third codes CODE1-CODE3 with reference to the external resistor device REXT. The first code CODE1 and the third code CODE3 may be configured as pull-up codes for determining pull-up resistance.

The input/output circuit 710 may receive a data clock signal WCK at a relatively high speed through the fourth pad 704, and may receive an address signal ADDR at a relatively slow speed through the fifth pad 705. In example embodiments, the signal received through the fifth pad 705 may be implemented as a main clock signal.

The input/output circuit 710 may include a plurality of receivers 711, 713, 715, and 717, at least one transmitter 712, and a plurality of resistor circuits 714, 716, and 718. Both a transmitter 712 and a receiver 711 may be connected to the first pad 701, the receiver 711 may receive write data WDATA from an external host, and the transmitter 712 may transmit read data RDATA to an external host.

Referring to FIG. 15, the coils 706 and 707 may be connected to the first pad 701 and the fourth pad 704 for receiving or transmitting a signal at a relatively high speed, whereas a coil may not be connected to the second pad 702 and the fifth pad 705 receiving a signal at a low speed. Each of the coils 706 and 707 may provide inductance compensating for influence of a parasitic component which may degrade integrity of the signals DQ and WCK transmitted and received through the first pad 701 and the fourth pad 704.

When the ZQ calibration operation starts, the calibration circuit 708 may operate as in the aforementioned example embodiment described with reference to FIGS. 10 to 12 and may output the first to third codes CODE1-CODE3. For example, pull-up resistance provided by the resistor circuit 714 connected to the second pad 702 may be determined by the first code CODE1. Also, pull-down resistance connected to the first pad 701 may be determined by the second code CODE2, and pull-up resistance connected to the first pad 701 may be determined by the third code CODE3. The first code CODE1 may also be input to a resistor circuit 718 connected to the fifth pad 705 to which the coils 706 and 707 are not connected. At least one of the second code CODE2 and the third code CODE3 may be input to the resistor circuit 716 connected to the fourth pad 704.

As described in the aforementioned example embodiment with reference to FIGS. 10 to 12, among the first to third codes CODE1-CODE3 output by the calibration circuit 708, the first code CODE1 may be determined by an operation of copying resistance of an external resistor device REXT. Each of the second code CODE2 and the third code CODE3 may be determined by reflecting a resistive component of a duplicated coil, duplicated to have the same inductance as resistance of one of the coils 706 and 707. Accordingly, the pull-up resistance determined by the first code CODE1 may be different from the pull-up resistance determined by the third code CODE2, and desired or optimal pull-up resistance and desired or optimal pull-down resistance considering a resistive component of each of the coils 706 and 707 may be implemented in the input/output circuit 710.

For example, the transmitter 712 outputting the first signal DQ at a relatively fast first speed may receive the second code CODE2 and the third code CODE3, and Termination resistance connected to the first pad 701 may be determined based on the third code CODE3. Since each of the second code CODE2 and the third code CODE3 may be determined by the calibration circuit in consideration of a resistive component of the coil 706, a desired or optimum termination resistance reflecting a resistive component of the coil 706 may be connected to the pad 701.

Referring to FIG. 16, the semiconductor device 700A may include a plurality of pads 701-705, a calibration circuit 708, and an input/output circuit 710A. The configurations of the plurality of pads 701-705, the calibration circuit 708 and the external resistor device REXT may be similar to those in the aforementioned example embodiment described with reference to FIG. 15.

In the example embodiment illustrated in FIG. 16, a first transmission coil 706A and a second transmission coil 706B may be connected to the first pad 701, and a receiver receiving the first signal DQ may be connected to a node between the first transmission coil 706A and the second transmission coil 706B. Accordingly, the first signal DQ received by the first pad 701 may be input to the receiver 711 through only the first transmission coil 706A. The first signal DQ output by the transmitter 712 may be transmitted to the first pad 701 through the first transmission coil 706A and the second transmission coil 706B, which may be to compensate for a difference in properties between the receiver 711 and the transmitter 712 with respect to the first signal DQ transmitted and received at the same or substantially the same speed.

Figure 17:
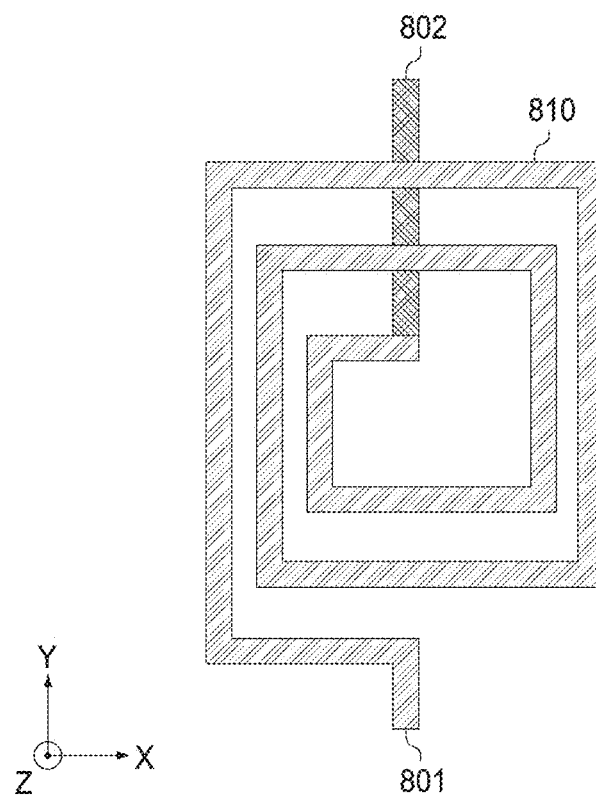
FIG. 17 is a diagram illustrating an inductor circuit included in a semiconductor device according to an example embodiment of the inventive concepts.

FIG. 17 is diagrams illustrating an inductor circuit included in a semiconductor device according to an example embodiment.

Referring to FIG. 17, a semiconductor device in an example embodiment may include an inductor circuit 800. As described above, the inductor circuit 800 may be provided as a coil for canceling parasitic components present in a signal path. The inductor circuit 800 may include a coil pattern 810, and a first connection line 801 and a second connection line 802 connected to both sides of the coil pattern 810. The coil pattern may include a plurality of line patterns extending in the first direction (e.g., X-axis direction) or the second direction (e.g., Y-axis direction).

In the example embodiment illustrated in FIG. 17, the first connection line 801 may be configured to extend from a first end on an external side of the coil pattern and may be disposed on the same or substantially the same layer as the coil pattern. The second connection line 802 may be configured to extend from the second end on an internal side of the coil pattern and may be disposed on a layer different from that of the coil pattern. Accordingly, the first connection line 801 and the second connection line 802 may be disposed on different layers.

The inductor circuit 800 may be connected to a transmission path of a signal input and output at a high speed, such as, for example, a data rate of several tens of Gbps. For example, the inductor circuit 800 may be connected between a transmitter outputting a data signal and a DQ pad outputting a data signal to an external host. Due to inductance of the inductor circuit 800, influence of a parasitic component present between an output terminal of the transmitter and the DQ pad may be reduced.

The inductor circuit 800 may be included in a calibration circuit disposed in the semiconductor device in addition to a transmission path of a signal exchanged between the semiconductor device and an external host. The calibration circuit may include a duplicate inductor circuit, duplicating the inductor circuit 800 formed in the signal transmission path, and may reflect a resistive component of the duplicate inductor circuit and may generate codes determining pull-down resistance and pull-up resistance in the ZQ calibration operation. Accordingly, even when the inductor circuit 800 for compensating for a parasitic component is connected to the signal transmission path, the desired or optimized pull-down resistance and pull-up resistance may be determined for the input/output circuit of the semiconductor device, and impedance mismatch may be reduced.

Figure 18:
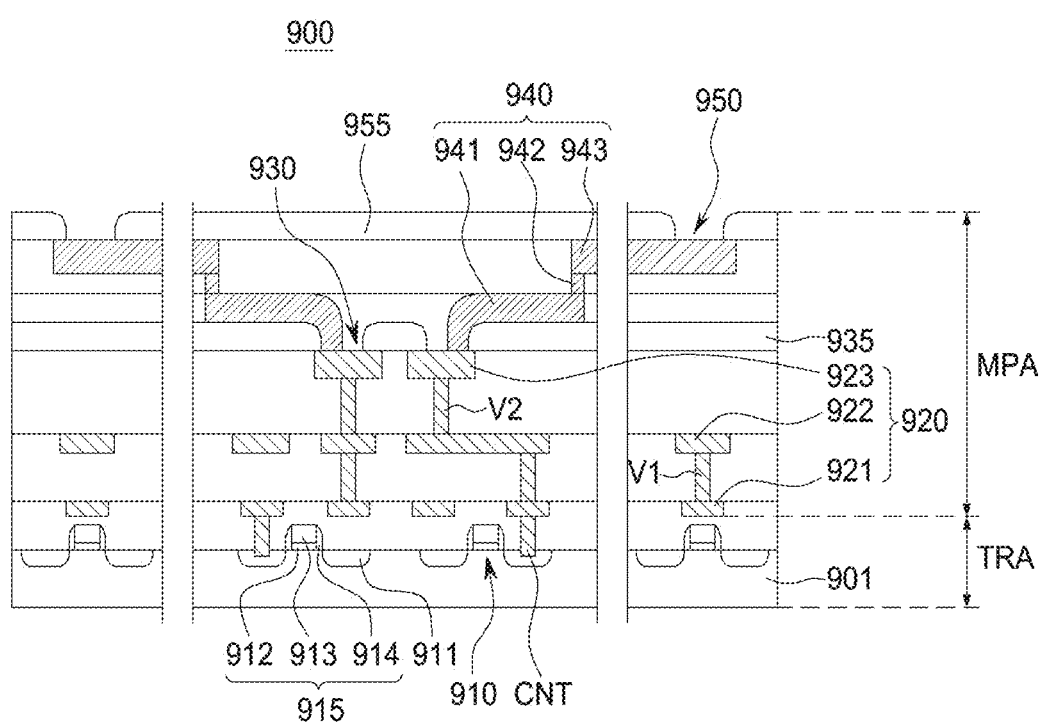
FIG. 18 is a diagram illustrating a semiconductor device according to an example embodiment of the inventive concepts.

FIG. 18 is diagrams illustrating a semiconductor device according to an example embodiment.

Referring to FIG. 18, a semiconductor device 900 according to an example embodiment may include a device region TRA and a wiring region MPA. The device region TRA may include a semiconductor substrate 901 and a plurality of devices 910 formed on the semiconductor substrate 901. The wiring region MPA may include a plurality of wiring patterns 920 connected to the plurality of devices 910, and redistribution layers 940 connected to the plurality of wiring patterns 920.

The plurality of devices 910 may include transistors formed on the semiconductor substrate 901. For example, each of the plurality of devices 910 may include a source/drain region 911 and a gate structure 915. The gate structure 915 may include a gate insulating layer 912, a gate electrode layer 913, and a gate spacer 914. A device contact CNT may be connected to the source/drain region 911 and the gate structure 915, and the device contact CNT may be connected to at least one of the plurality of wiring patterns 920.

The plurality of wiring patterns 920 may be disposed on the plurality of wiring layers 921-923 in a divided manner. For example, the first wiring patterns disposed on the first wiring layer 921 may be connected to the plurality of devices 910 through the device contact CNT. The second wiring patterns disposed on the second wiring layer 922 may be connected to the lower wiring patterns through the first via structure V1, and the third wiring patterns disposed on the third wiring layer 923 may be connected to the intermediate wiring patterns through the second via structure V2. In the example embodiment illustrated in FIG. 12, the wiring patterns 920 may be disposed on three wiring layers 921-923, but in some example embodiments, the number of wiring layers on which the wiring patterns 920 are may be varied.

A thickness of each of the plurality of wiring patterns 920 may be determined according to the wiring layers 921-923 on which the wiring patterns 920 are disposed, respectively. Referring to FIG. 12, thicknesses of the first wiring patterns disposed on the first wiring layer 921 may be the smallest and thicknesses of the third wiring patterns disposed on the third wiring layer 923 may be the largest. In other words, the thickness of the wiring patterns 920 may increase as the distance from the semiconductor substrate 901 increases in a direction perpendicular or substantially perpendicular to the upper surface of the semiconductor substrate 901.

At least a portion of regions of the third wiring patterns disposed on the third wiring layer 923 may provide a plurality of center pads 930. The center pads 930 may be disposed in a center region of the semiconductor device 900, and may be exposed by a first passivation layer 935. The center pads 930 may be connected to the redistribution layers 940 formed above the third wiring layer 923.

The redistribution layers 940 may include a first redistribution layer 941, an RDL via 942, and a second redistribution layer 943. The first redistribution layer 941 may be configured to be directly connected to the center pads 930, and may be connected to the second redistribution layer 943 through the RDL via 942. At least a portion of regions of the second redistribution layer 943 may provide edge pads 950 disposed in an edge region of the semiconductor device 900. The edge pads 950 may be exposed by the second passivation layer 955, and in an example embodiment, the edge pads 950 may be connected to pads of a substrate on which the semiconductor device 900 is mounted through a wire.

In the semiconductor device 900 according to the example embodiment illustrated in FIG. 12, an inductor circuit may be formed in the redistribution layers 940 connecting the center pad 930 to the edge pad 950. As described above, when the inductor circuit includes a spiral-shaped coil pattern, at least two layers may be used to form the inductor circuit. By implementing the redistribution layers 940 using the first redistribution layer 941 and the second redistribution layer 943 formed on different levels from an upper surface of the semiconductor substrate 901, an inductor circuit may be formed on the redistribution layers 940.

The inductor circuit may provide a coil included in the calibration circuit. As described above, in the semiconductor device 900 in an example embodiment, the calibration circuit for the ZQ calibration operation may include at least one coil. A coil included in the calibration circuit may have the same or substantially the same inductance as that of a transmission coil connected to at least one of pads through which the semiconductor device 900 transmits a signal to and receives a signal from an external host.

In the example embodiment illustrated in FIG. 18, the plurality of devices 910 may provide pull-up units, pull-down units, and code generators included in the calibration circuit. For example, among the plurality of devices 910, devices directly connected to the inductor circuit may include a device included in one of pull-down units and a device included in a comparator among code generators.

Figure 19:
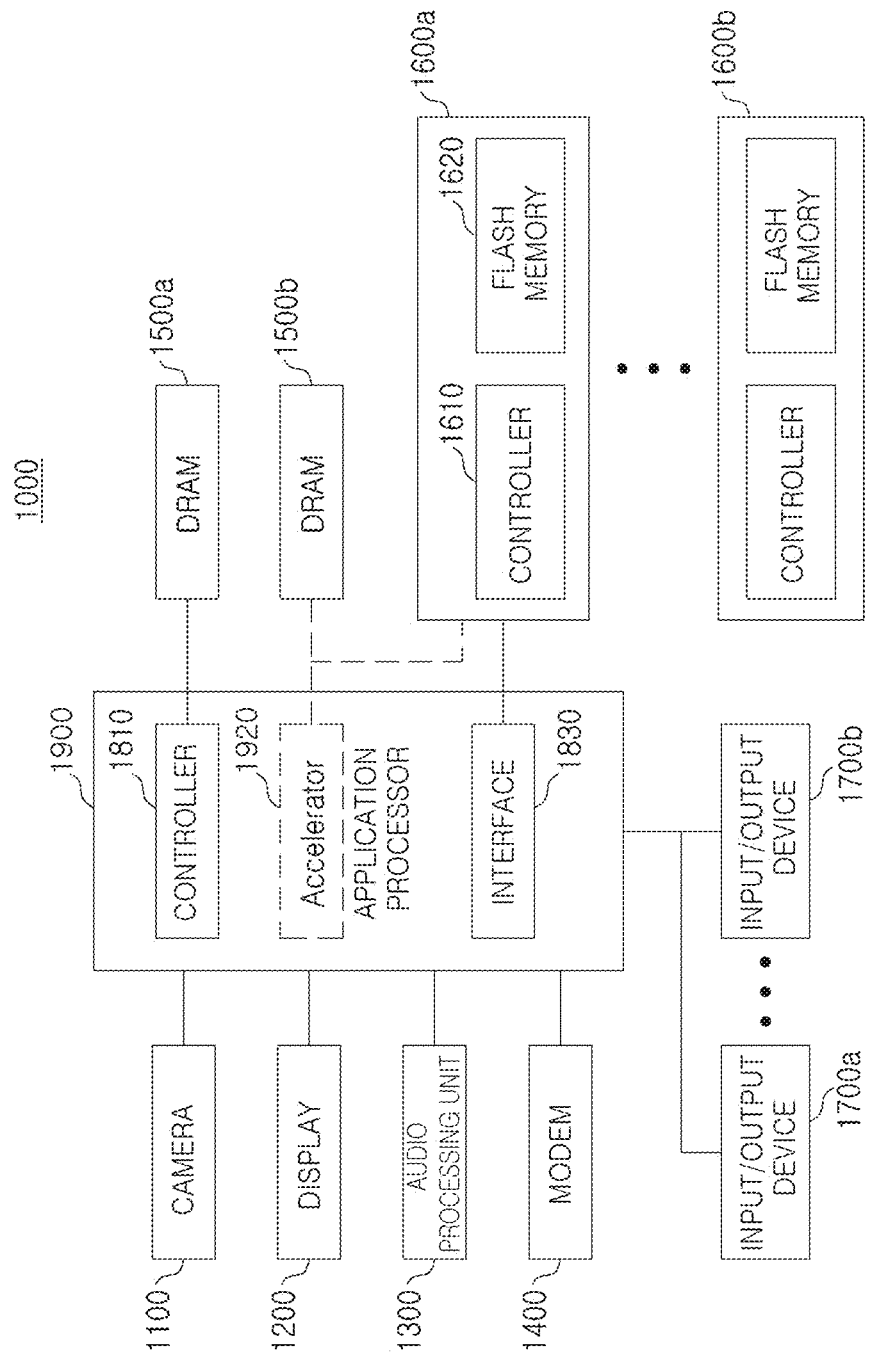
FIG. 19 is a diagram illustrating a system including a semiconductor device according to an example embodiment of the inventive concepts.

FIG. 19 is a diagram illustrating a system including a semiconductor device according to an example embodiment.

Referring to FIG. 19, the mobile device 1000 may include a camera 1100, a display 1200, an audio processing unit 1300, a modem 1400, DRAMs 1500*a* and 1500*b*, and flash memory devices 1600*a* and 1600*b*, input/output devices 1700*a* and 1700*b*, a sensor device, and an application processor 1900 (hereinafter, "AP").

The mobile device 1000 may be implemented as a laptop computer, a portable terminal, a smartphone, a tablet PC, a wearable device, a healthcare device, or an Internet-of-Things (IoT) device, but example embodiments are note limited thereto. Also, the mobile device 1000 may be implemented as a server or a personal computer.

Various components included in the mobile device 1000 may operate in synchronization with a desired (or, alternatively predetermined) clock. For example, the display 1200 may display a screen according to a desired (or, alternatively predetermined) refresh rate, and the DRAMs 1500*a* and 1500*b* and the flash memory devices 1600*a* and 1600*b* may also store and read data at a desired (or, alternatively predetermined) speed, or may operate according to a desired (or, alternatively predetermined) clock to transmit data to and receive data from external devices. The input/output devices 1700*a* and 1700*b* and the application processor 1900 may also operate according to a desired (or, alternatively predetermined) clock.

The camera 1100 may obtain a still image or a video under control from a user. The mobile device 1000 may obtain specific information using a still image/video captured by the camera 1100, or may convert the still image/video into other types of data such as text and may store the data. The camera 1100 may include a plurality of cameras having different fields of view or aperture values. Also, the camera 1100 may further include a camera generating a depth image using depth information of a subject and/or background, in addition to a camera generating an actual image by photographing a subject.

The display 1200 may provide a touch screen function such that the display 1200 may be used as an input device of the mobile device 1000. Also, the display 1200 may be provided integrally with a fingerprint sensor and may provide a security function of the mobile device 1000. The audio processing unit 1300 may process audio data stored in the flash memory devices 1600*a* and 1600*b* or audio data included in content received from an external entity through the modem 1400 or the input/output devices 1700*a* and 1700*b*.

The modem 1400 may modulate and transmit a signal for transmission and reception of wired/wireless data, and may also demodulate a signal received from an external entity and may restore the original signal. The input/output devices 1700*a* and 1700*b* may be configured to provide digital input/output, and may include a port connected to an external recording medium, an input device such as a touch screen or a mechanical button key, and an output device outputting vibrations in a haptic manner.

The sensor device 1800 may include a plurality of sensors collecting various information from an external entity. In some example embodiments, the sensor device 1800 may include an illuminance sensor detecting brightness of light, a gyro sensor detecting movement of the mobile device 1000, and a biosensor for obtaining biometric information from a user's body in contact with and/or approximate to the mobile device 1000, but example embodiments are not limited thereto.

The AP 1900 may control overall operation of the mobile device 1000. Specifically, the AP 1900 may control the display 1200 to display a portion of the content stored in the flash memory devices 1600*a* and 1600*b* on the screen. Also, when a user input is received through the input/output devices 1700*a* and 1700*b*, the AP 1900 may perform a control operation corresponding to the user input.

In some example embodiments, the AP 1900 may include an accelerator block 1920 which may be a dedicated circuit for AI data operation. Alternatively, in some example embodiments, an accelerator chip may be provided separately from the AP 1900, and a DRAM 1500*b* may be additionally connected to the accelerator block 1920 or the accelerator chip. The accelerator block 1920 may be implemented as a function block professionally performing a specific function of the AP 1900, and may include a graphics processing unit (GPU) which may be function blocks professionally performing graphic data processing, a neural processing unit (NPU) which may be a block professionally performing AI calculations and inference, and a data processing unit (DPU) which may be a block specializing in data processing, but example embodiments are not limited thereto. In some example embodiments, the AP 1900 may include a controller 1810 and an interface 1830.

The calibration circuit in some example embodiments may be variously employed in components connected to each other in the mobile device 1000 to communicate with each other. For example, to adjust pull-up resistance and/or pull-down resistance connected to a pad inputting and outputting signals from at least one of the camera 1100, the display 1200, the audio processing unit 1300, the modem 1400, the, the input/output devices 1700*a* and 1700*b*, the sensor device, and the AP 1900, the calibration circuit according to some example embodiments may be employed.

For example, a transmission coil for canceling influence of a parasitic component may be connected to a DQ pad exchanging a data signal with the AP 1900 at a relatively high data rate in the DRAM 1500*a* and 1500*b* and the flash memory devices 1600*a* and 1600*b*. The calibration circuit provided in each of the DRAMs 1500*a* and 1500*b* and the flash memory devices 1600*a* and 1600*b* may include a coil duplicated to have the same inductance as that of the transmission coil, and may generate codes determining pull-down resistance and pull-up resistance by reflecting a resistive component of the coil. Accordingly, in the DRAMs 1500*a* and 1500*b* and the flash memory devices 1600*a* and 1600*b*, desired or optimized pull-up resistance and pull-down resistance may be connected to each of the pad to which the transmission coil is not connected and the pad to which the transmission coil is connected, such that impedance mismatch may be reduced, and signal integrity may improve. The flash memory device 1600a may include a controller 1610 and a flash memory 1620. According to some example embodiments, a transmission coil for reducing influence of a parasitic component may be connected between at least one of the pads and the input/output circuit. The ZQ calibration circuit in some example embodiments may output a plurality of codes such that different resistance may be connected to the input/output circuit to which the transmission coil is connected and the input/output circuit to which the transmission coil is not connected. Accordingly, by connecting desired or optimal resistance in consideration of a resistive component of the transmission coil to the input/output circuit, impedance mismatch may be reduced such that signal integrity may be secured, and performance of a semiconductor device supporting high-speed data communication may improve.

One or more of the elements disclosed above may include or be implemented in one or more processing circuitries such as hardware including logic circuits; a hardware/software combination such sa a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

While some example embodiments have been illustrated and described above, modifications and variations may be made without departing from the scope of the inventive concepts.

What is claimed is:

1. A calibration circuit, comprising:
   a first pull-up unit, a second pull-up unit and a third pull-up unit each connected to a first power supply node configured to supply a first power supply voltage;
   a first pull-down unit and a second pull-down unit each connected to a second power supply node configured to supply a second power supply voltage smaller than the first power supply voltage;
   a first code generator configured to generate a first code by comparing a voltage of a pad at which the first pull-up unit is connected to an external resistor with a reference voltage;
   a second code generator configured to generate a second code by comparing a voltage of a first intermediate node with the reference voltage and output the second code to the first and second pull-down units, the first intermediate node between the second pull-up unit and a coil, the second pull-up unit configured to provide resistance according to the first code or a shift code obtained by shifting the first code; and
   a third code generator configured to generate a third code by comparing a voltage of a second intermediate node between the second pull-down unit and the third pull-up unit with the reference voltage.

2. The calibration circuit of claim 1, wherein a level of the reference voltage is half of a level of the first power supply voltage.

3. The calibration circuit of claim 1, wherein each of the first code generator, the second code generator and the third code generator includes a comparator and a counter connected to an output terminal of the comparator.

4. The calibration circuit of claim 3, wherein the comparator of the first code generator includes a first input terminal connected to the pad and a second input terminal configured to receive the reference voltage.

5. The calibration circuit of claim 3, wherein the comparator of the second code generator includes a first input terminal connected to the first intermediate node and a second input terminal configured to receive the reference voltage.

6. The calibration circuit of claim 3, wherein the comparator of the third code generator includes a first input terminal connected to the second intermediate node and a second input terminal configured to receive the reference voltage.

7. The calibration circuit of claim 1, wherein a magnitude of resistance provided by the first pull-up unit based on the first code is different from a magnitude of resistance provided by the second pull-up unit based on the shift code.

8. The calibration circuit of claim 1,
   wherein the coil is a first coil connected between the first intermediate node and the first pull-down unit, and
   the calibration circuit further includes a second coil connected between the second intermediate node and the second pull-down unit, and a third coil connected between the second intermediate node and the third pull-up unit.

9. The calibration circuit of claim 8, wherein the first coil, the second coil, and the third coil have the same inductance.

10. A calibration circuit, comprising:
    a first code generator circuit including a first pull-up unit connected to a pad, and a first comparator having an input terminal connected to the pad and an output terminal connected to the first pull-up unit, the pad connected to an external resistor;
    a second code generator circuit including a second pull-up unit connected to the output terminal of the first comparator, a first coil connected to the second pull-up unit, a first pull-down unit connected to the first coil, and a second comparator having an input terminal connected to a node between the first coil and the second pull-up unit, the second comparator including an output terminal connected to the first pull-down unit; and
    a third code generator circuit including a second pull-down unit connected to an output terminal of the second comparator, a third pull-up unit, and a third comparator having an input terminal connected to a node between the second pull-down unit and the third pull-up unit, the third comparator including an output terminal connected to the third pull-up unit.

11. The calibration circuit of claim 10, wherein the third code generator circuit includes a second coil and a third coil connected to the input terminal of the third comparator.

12. The calibration circuit of claim 11, wherein the first coil, the second coil, and the third coil have the same inductance.

13. The calibration circuit of claim 10, wherein the input terminal of the third comparator is directly connected to each of the second pull-down unit and the third pull-up unit.

14. The calibration circuit of claim 10, further comprising:
an adder connected between the output terminal of the first comparator and the second pull-up unit.

15. A semiconductor device, comprising:
a first pad configured to transmit and receive a first signal at a first rate, the first pad connected to a transmission coil;
a second pad configured to receive a second signal at a second rate slower than the first rate;
a third pad connected to an external resistor; and
a calibration circuit including a first code generator configured to generate a first code by comparing a voltage of the third pad with a reference voltage, a second code generator configured to generate a second code by comparing the reference voltage with a voltage of a first intermediate node at which a pull-up unit configured to provide resistance according to the first code is connected to a first coil, and a third code generator configured to generate a third code by comparing the reference voltage with a voltage of a second intermediate node to which a pull-down unit configured to provide resistance according to the second code is connected,
wherein pull-up resistance connected to the second pad is determined by the first code, pull-down resistance connected to the first pad is determined by the second code, and pull-up resistance connected to the first pad is determined by the third code, and
wherein inductance of the first coil is equal to inductance of the transmission coil.

16. The semiconductor device of claim 15,
wherein the first signal is at least one of a data signal and a data clock signal, and
wherein the second signal is at least one of a command/address signal and a main clock signal.

17. The semiconductor device of claim 15, further comprising:
a transmitter configured to output the first signal to the first pad,
wherein the transmission coil includes a first transmission coil and a second transmission coil connected between an output terminal of the transmitter and the first pad.

18. The semiconductor device of claim 17, further comprising:
a receiver connected to a node between the first transmission coil and the second transmission coil.

19. The semiconductor device of claim 15, wherein the pull-up resistance determined by the first code is different from the pull-up resistance determined by the third code.

20. The semiconductor device of claim 15,
wherein the calibration circuit further includes an adder configured to input a shift code generated by shifting the first code to the pull-up unit, and
wherein the adder is configured to generate the shift code based on a difference between resistance connected to the first pad and resistance connected to the second pad.

* * * * *